(12) United States Patent
Kim et al.

(10) Patent No.: US 9,596,672 B2
(45) Date of Patent: Mar. 14, 2017

(54) TERMINAL AND OPERATING METHOD THEREOF

(71) Applicant: LG ELECTRONICS INC., Seoul (KR)

(72) Inventors: Kwangsik Kim, Seoul (KR); Minseok Kang, Seoul (KR); Soojong Jin, Seoul (KR); Kwanghee Choi, Seoul (KR); Hyunuk Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 88 days.

(21) Appl. No.: 14/582,605

(22) Filed: Dec. 24, 2014

(65) Prior Publication Data
US 2015/0223200 A1  Aug. 6, 2015

(30) Foreign Application Priority Data
Dec. 27, 2013 (KR) .......... 10-2013-0165448

(51) Int. Cl.
| | |
|---|---|
| H04W 68/00 | (2009.01) |
| H04W 68/02 | (2009.01) |
| G10L 17/00 | (2013.01) |
| H03G 3/20 | (2006.01) |
| H04W 4/16 | (2009.01) |
| G06F 9/54 | (2006.01) |

(52) U.S. Cl.
CPC .......... *H04W 68/02* (2013.01); *G06F 9/542* (2013.01); *G10L 17/00* (2013.01); *H03G 3/20* (2013.01); *H04W 4/16* (2013.01); *H04W 68/005* (2013.01)

(58) Field of Classification Search
CPC ..... H04W 4/16; H04W 68/02; H04W 68/005; G06F 9/542; G10L 17/00; H03G 3/20
See application file for complete search history.

(56) References Cited

U.S. PATENT DOCUMENTS

| | | | |
|---|---|---|---|
| 7,250,955 B1 | 7/2007 | Beeman et al. | |
| 8,346,881 B1 | 1/2013 | Cohen | |
| 8,868,028 B1* | 10/2014 | Kaltsukis | H04W 4/028 455/404.1 |
| 2003/0046421 A1 | 3/2003 | Horvitz et al. | |
| 2005/0204009 A1 | 9/2005 | Hazarika et al. | |
| 2006/0253548 A1 | 11/2006 | Vitanov et al. | |
| 2009/0077188 A1* | 3/2009 | Arneson | G06F 9/542 709/206 |
| 2011/0145836 A1 | 6/2011 | Wheeler et al. | |
| 2011/0161987 A1 | 6/2011 | Huang et al. | |
| 2012/0149342 A1 | 6/2012 | Cohen et al. | |

(Continued)

FOREIGN PATENT DOCUMENTS

| | | |
|---|---|---|
| EP | 0611070 A2 | 8/1994 |
| WO | WO 2009/018347 A1 | 2/2009 |

*Primary Examiner* — Ajit Patel
(74) *Attorney, Agent, or Firm* — Birch, Stewart, Kolasch & Birch, LLP

(57) ABSTRACT

A method of controlling a mobile terminal, and which includes receiving, via a controller of the mobile terminal, an event trigger indicating a first event has occurred on the mobile terminal; checking, via the controller, a notification level allocated to the first event corresponding to the event trigger; and outputting a notification notifying the first event has occurred on the mobile terminal with a notification strength corresponding to the notification level allocated to the first event.

20 Claims, 19 Drawing Sheets

(56) References Cited

U.S. PATENT DOCUMENTS

2012/0231849 A1    9/2012  Yamashita
2014/0068632 A1*   3/2014  Tan .......................... G06F 9/542
                                                              719/313

* cited by examiner

TERMINAL AND OPERATING METHOD THEREOF

CROSS-REFERENCE TO RELATED APPLICATIONS

The present application claims priority under 35 U.S.C. 119 and 35 U.S.C. 365 to Korean Patent Application No. 10-2013-0165448 filed on Dec. 27, 2013, which is hereby incorporated by reference in its entirety.

BACKGROUND OF THE INVENTION

The present invention relates to a terminal and an operating method thereof, and particularly, to an event processing method of a mobile terminal. Terminals may be divided into mobile terminals and stationary terminals. The mobile terminals are again divided into handheld terminals and vehicle mounted terminals.

Such a terminal is being realized as a multimedia player type including complex functions such as capturing photos or moving pictures, playback of music or video files, a game, or broadcast reception, are equipped.

When obtaining an event such as reception of an incoming call or a text message while a user performs tasks using a terminal, the terminal notifies the user of the event. However, the related art terminal only notifies the event in an identical scheme regardless of various situations or a request by a terminal user.

SUMMARY OF THE INVENTION

Embodiments of the invention provide a terminal and an operating method thereof enabling event notification to be performed by adaptively differentiating event notification strengths according to various situations or requests by a terminal user.

In one embodiment, an operating method of a terminal device, includes: obtaining an event trigger; obtaining importance information allocated to the event trigger; checking a notification level allocated to a first event corresponding to the event trigger; determining notification strength based on the importance information allocated to the event trigger and the notification level allocated to the first event; and performing notification of the first event according to the determined notification strength.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Figure 1:
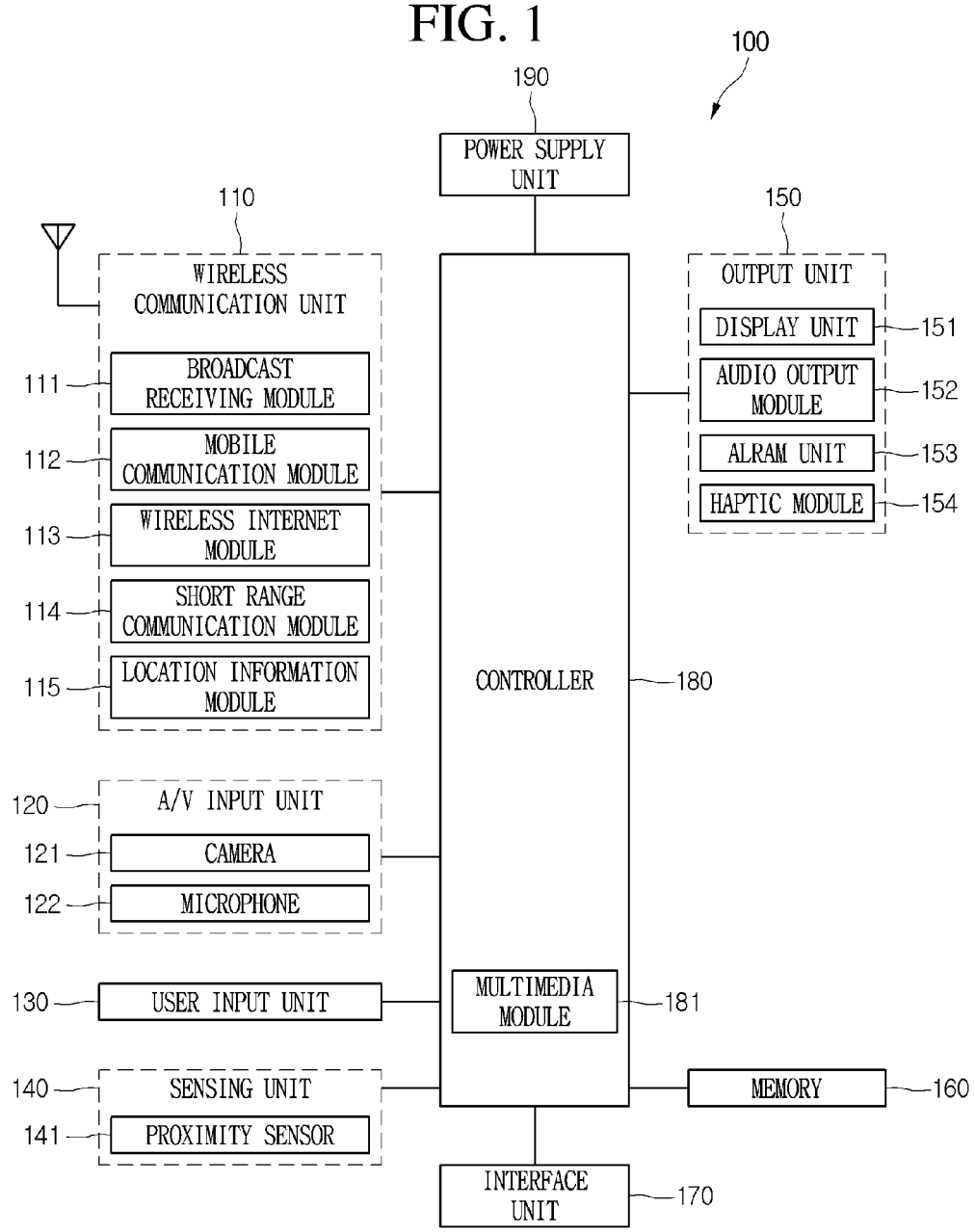
FIG. 1 is a block diagram of a mobile terminal related to an embodiment of the present invention.

Reference will now be made in detail to the embodiment of the present inventions of the present invention, examples of which are illustrated in the accompanying drawings.

In the following description, usage of suffixes such as 'module', 'part' or 'unit' used for referring to elements is given merely to facilitate explanation of the present invention, without having any significant meaning by itself.

A terminal and an operating method thereof according to an embodiment of the present invention will be described in detail with reference to the accompanying drawings. The invention may, however, be embodied in many different forms and should not be construed as being limited to the embodiment of the present inventions set forth herein; rather, that alternate embodiments included in other retrogressive inventions or falling within the spirit and scope of the present invention can easily be derived through adding, altering, and changing, and will fully convey the concept of the invention to those skilled in the art.

Mobile terminals described herein may include a mobile phone, a smart phone, a laptop computer, a digital broadcast terminal, a personal digital assistant, a portable multimedia player, a navigation device, a wearable terminal, etc. The wearable terminal may include a watch type terminal, a glasses type terminal. However, a configuration according to an embodiment of the present invention may be applied to a fixed terminal, such as a digital TV, or a desktop computer, except a case applicable only to a mobile terminal.

In the present invention, a term 'event' and a term 'event trigger' are distinguishably used as shown in Table 1.

TABLE 1

| Function or application | Registered event (or event) | Event trigger |
| --- | --- | --- |
| Battery | Low battery event | Smaller battery remnant amount than a reference value |
| Alarm | Alarm event | Arrive at an alarm time of a corresponding alarm event |
| Message | Message arrival event | Received message |
| Call | Incoming call event | Incoming call |
| Call | Missed call event | Missed call |
| Call | Low call signal strength event | Lower call signal strength than a reference value |
| News | News event | Received news message |
| Weather | Weather event | Received weather message |
| Schedule | Schedule reach event | Reach scheduled time of a corresponding schedule reach event |
| Terminal temperature | High terminal temperature event | ligher terminal temperature than a reference value |
| Wi-Fi | Low Wi-Fi signal strength event | Lower Wi-Fi signal strength than a reference value |
| DMB | Low DMB signal strength event | Lower DMB signal strength than a reference value |
| Bluetooth | Bluetooth paring request event | Bluetooth pairing request |
| Bluetooth | Bluetooth pairing complete event | Bluetooth pairing complete |
| Bluetooth | Bluetooth data exchange start event | Bluetooth data exchange start |
| Bluetooth | Bluetooth data exchange complete event | Bluetooth data exchange complete |
| Data communication | Data remnant amount event | Data remnant amount reaching a set value |

As shown in Table 1, a mobile terminal or an application of a mobile terminal can have one or a plurality of registered events. When obtaining an event trigger, the mobile terminal can notify an event corresponding to the obtained event trigger. A notification priority and a notification level can also be allocated to the registered event.

Although Table 1 shows that one application includes one registered event, one application may have a plurality of registered events respectively corresponding to a plurality of event triggers related to the application.

TABLE 2

| Function or application | Registered event (or event) |
| --- | --- |
| Battery | Low battery events respectively corresponding to a plurality of battery levels |
| Alarm | Alarm events respectively corresponding to a plurality of alarm times |
| Message | A plurality of message arrival events respectively corresponding to a plurality of registered contact points |
| Call | A plurality of incoming call events respectively corresponding to a plurality of registered contact points |
| Call | A plurality of missed call events respectively corresponding to a plurality of registered contact points |
| Call | A plurality of low call signal strength events respectively corresponding to a plurality of call signal strengths |
| News | A plurality of news events respectively corresponding to a plurality of news categories (economy, polities, entertainments, etc.) |
| Weather | Weather events respectively corresponding to a plurality of areas |
| Schedule | A plurality of schedule reach events respectively corresponding to a plurality of scheduled times |
| Terminal temperature | A plurality of high terminal temperature events respectively corresponding to a plurality of warning temperatures |
| Wi-Fi | A plurality of low Wi-Fi signal strength events respectively corresponding to a plurality of Wi-Fi signal strengths |
| DMB | A plurality of low DMB signal strength events respectively corresponding to a plurality of DMB signal strengths |
| Bluetooth | A plurality of Bluetooth pairing request events respectively corresponding to a plurality of Bluetooth devices |

Notifications described herein may be performed with one of voice (speech briefing) notification, sound notification, vibration notification, and GUI output notification, or with a combination of two or more thereof. The voice notification can output voice (speech) schematically or entirely explaining an event in order to notify the event.

Further, the sound notification is discerned from the voice notification and can output a mechanical sound, music, or a beep sound to notify an event. The vibration notification can output vibration to notify an event, and the GUI notification displays a GUI element corresponding to an event in order to notify the event.

Hereinafter, a structure of a mobile terminal according to an embodiment of the present invention is described with reference to FIG. 1 In particular, FIG. 1 is a block diagram of a mobile terminal according to an embodiment of the present invention.

As shown, the mobile terminal 100 may include a wireless communication unit 110, an audio/video (A/V) input unit 120, a user input unit 130, a sensing unit 140, an output unit 150, a memory 160, an interface unit 170, a controller 180, and a power supply unit 190. The elements shown in FIG. 1 are not essential, and the mobile terminal 100 may have more or less elements than them.

The wireless communication unit 110 may include one or more modules enabling wireless communication between the mobile terminal 100 and a wireless communication system, or between the mobile terminal 100 and a network in which the mobile terminal 100 exists. For example, the wireless communication unit 110 may include a broadcast receiving module 111, a mobile communication module 112, a wireless internet module 113, a short range communication module 114, and a location information module 115.

The broadcast receiving module 111 receives a broadcast signal and/or broadcast related information from an external broadcast management server through a broadcast channel. The broadcast channel may include a satellite channel, or a groundwave channel. The broadcast management server may mean a server creating and transmitting a broadcast signal and/or broadcast related information or a server receiving and transmitting a pre-created broadcast signal and/or broadcast related information to a terminal. The broadcast signal may include not only a TV broadcast signal, a radio broadcast signal, and a data broadcast signal, but also a broadcast signal of a type having a data broadcast signal combined to a TV broadcast signal or a radio broadcast signal.

The broadcast related information may mean information related to a broadcast channel, a broadcast program, or a broadcast service provider. The broadcast related information may also be provided through a mobile communication network. In this instance, the broadcast related information may be received by the mobile communication module 112.

The broadcast related information may exist in various types, for example, an electronic program guide (EPG) of digital multimedia broadcast (DMB), or an electronic service guide (SG) of digital video broadcast-handheld (DVB-H).

The broadcast receiving module 111 may receive a digital broadcast signal using a digital broadcast system, such as DMB-terrestrial (DMB-T). DMB-satellite (DMB-S), media forward link only (MediaFLO), DVB-H, or integrated services digital broadcast-terrestrial (ISDB-T). The broadcast receiving module 111 may be configured to be proper not only to the above-described digital broadcast system, but also to other broadcast systems. The broadcast signal and/or broadcast related information received through the broadcast receiving module 111 may be stored in the memory 160.

The mobile communication module 112 transmits and receives a wireless signal with at least one of a base station, an external terminal, and a server on the mobile communication network. The wireless signal may include a voice call signal, a video call signal, or various types of data according to transmission and reception of a text/multimedia message.

The wireless internet module 113 refers to a module for wireless internet access, and may be embedded in the mobile terminal 100 or disposed externally. As the wireless internet technology, wireless LAN (Wi-Fi), wireless broadband (Wibro), world interoperability microwave access (Wimax), or high speed downlink packet access (HSDPA) may be employed.

The short range communication module 114 refers to a module for short-range-communication. As the short range communication technology, Bluetooth, radio frequency identification (RFD), infrared data association (IrDA), ultra wideband (UWB), or ZigBee may be employed.

The location information module 115 is a module for obtaining a position of a mobile terminal. As a representative example, there is a global position system module (GPS) module.

Referring to FIG. 1, the A/V input unit 120 is for inputting an audio signal or a video signal, and may include a camera 121 and a microphone 122. The camera 121 processes a still image or image frames of a video obtained by an image sensor in a video call mode or a capturing mode. The processed image frames may be displayed on the display unit 151.

The image frames processed by the camera 121 are stored in the memory 160 or transmitted externally through the wireless communication unit 110. Two or more cameras 121 may be prepared according to use environment.

The microphone 122 receives external sound signals in a call mode, a recording mode, or a speech recognition mode and processes the sound signals to an electrical speech data. The processed speech data can be converted into a transmittable form and output to a mobile communication base station through the mobile communication module 112. Various noise removal algorithms may be implemented in the microphone 122, wherein the noise is generated in a process of receiving the external sound signals.

The user input unit 130 generates input data for allowing a user to control operations of the terminal. The user input unit 130 may be configured with a key pad, a dome switch, a touch pad (static pressure/static electricity), a jog wheel, a jog switch, etc.

The sensing unit 140 senses a current state of the mobile terminal 100, such as an open or close state of the mobile terminal 100, a position of the mobile terminal 100, a user contact, orientation of the mobile terminal 100, or acceleration/deceleration of the mobile terminal 100, and generates a sensing signal for controlling operations of the mobile terminal 100. For example, when the mobile terminal 100 is a slide phone type, the sensing unit 140 may sense whether the slide phone is open. In addition, the sensing unit 140 may sense whether the power supply unit 190 supplies power or whether the interface unit 170 interfaces an external device. Furthermore, the sensing unit 140 may include a proximity sensor 141.

The output unit 150 is for generating an output related to vision, sense of hearing, or sense of touch, and may include the display unit 151, an audio output module 152, an alarm unit 153, and a haptic module 154. The display unit 151 displays information processed in the mobile terminal 100. For example, when the mobile terminal 100 is in a call mode, a user interface (UI) or graphic user interface (GUI) related to a call is displayed. When the mobile terminal 100 is in a video call mode or a capturing mode, a captured or/and received image, or a UI or a GUI is displayed.

The display unit 151 may include at least any one of a liquid crystal display (LCD), a thin film transistor-liquid crystal display (TFT-LCD), an organic light-emitting diode (OLED), a flexible display, and a 3-dimensional display.

Some displays among them may be configured with a transparent type or light-transmissive type for seeing the outside therethrough. This may be referred to as a transparent display, and a representative example of the transparent display is a transparent OLED (TOLED). A rear structure of the display unit 151 may also be configured with a light-transmissive structure. Due to this structure, a user may see objects positioned in a rear side of the terminal body through a region occupied by the display unit 151 of the terminal body.

There may be two or more display units 151 according to an implementation type of the mobile terminal 100. For example, a plurality of display units may be disposed separately or in an integrated type on one surface, or respectively on different sides of the mobile terminal 100.

When the display unit 151 and a sensor (hereinafter, referred to as a 'touch sensor') sensing a touch operation form a mutual layered structure, the display unit 151 may be used as an input device other than an output device. The touch sensor may have a form of, for example, a touch film, a touch sheet, or a touch pad.

The touch sensor may be configured to convert a pressure applied to a specific portion of the display unit 151 or a capacitance change occurring on a specific portion of the display unit 151 into an electrical input signal. The touch sensor may be configured to detect a pressure upon being touched as well as a touched position and area.

When there is a touch input on the touch sensor, a corresponding signal(s) is transmitted to a touch controller. The touch controller processes the signal(s) and transmits the processed signal(s) to the controller 180. Accordingly, the controller 180 can detect which region on the display unit 151 is touched.

Referring to FIG. 1, the proximity sensor 141 may be disposed in an internal region of the mobile terminal enclosed by the touch screen or around the touch screen. The proximity sensor 141 refers to a sensor detecting, without a mechanical contact, whether there is an object approaching or existing around a predetermined detection surface by using an electromagnetic force or an infrared ray. The proximity sensor 141 has a longer life and higher utilization than a contact-type sensor.

As an example of the proximity sensor 141, there are a transmissive photoelectric sensor, a direct reflective photoelectric sensor, a mirror reflective photoelectric sensor, a high frequency oscillating proximity sensor, a capacitive proximity sensor, a magnetic proximity sensor, and an infrared proximity sensor. When the touch screen is an electrostatic type, the proximity sensor 141 may be configured to detect proximity of a pointer by an electric field change according to the approach of the pointer. In this instance, the touch screen (touch sensor) may be classified as a proximity sensor.

Hereinafter, for convenience of explanation, an action that the pointer is not in contact with the touch screen but approaches the touch screen to allow the pointer to be recognized as positioned over the touch screen is referred to as "proximity touch". In addition, an action that the pointer actually contacts with the touch screen is referred to as "contact touch". The position that the pointer is in a proximity touch over the touch screen means a position that the pointer vertically corresponds to the touch screen, when the pointer is in a proximity touch.

The proximity sensor senses the proximity touch and a proximity touch pattern (for example, a proximity touch distance, a proximity touch direction, a proximity touch speed, a proximity touch time, a proximity touch position, a proximity touch movement state, etc.). Information corresponding to the sensed proximity touch operation and proximity touch pattern may be output on the touch screen.

The audio output module 152 may output audio data received from the wireless communication unit 110 in call reception, a call mode, a recording mode, a speech recognition mode, or a broadcast reception mode, or audio data stored in the memory 160. The audio output module 152 may also output a sound signal (for example, a call reception sound, or a message reception sound, etc.) related to a function performed in the mobile terminal 100. The audio output module 152 may include a receiver, a speaker, or a buzzer.

The alarm unit 153 may output a signal for notifying an event occurrence of the mobile terminal 100. As an example of an event occurred in the mobile terminal, there is call signal reception, message reception, a key signal input, or a touch input, etc. The alarm unit 153 may also output a signal for notifying an event occurrence with different types, for example, vibration, other than a video signal or an audio signal. Since the video signal or audio signal may be output through the display unit 151 or the audio output module 152, they 151 and 152 may be classified into a part of the alarm unit 153.

The haptic module 154 generates various effects of touch senses that a user may feel. A representative example of the touch sense effect generated by the haptic module 154 is vibration. The strength and pattern of vibration generated by the haptic module 154 are controllable. For example, different vibrations may be synthesized to be output or sequentially output.

The haptic module 154 may generate various touch sense effects, other than the vibration, such as effect of a pin array moving vertically with respect to contact skin surface, jet force or suction force of air through a jet orifice or an air inlet, graze for skin surface, a contact of an electrode, or stimulus of an electrostatic force, or an effect of reproduction of cold and warmth by using devices capable of heat absorption or generation.

The haptic module 154 may be implemented to allow a user to feel a touch sense effect through muscle sense of fingers or arms as well as to deliver the touch sense effect through a direct contact. Two or more haptic modules 154 may be prepared according to a configuration aspect of the mobile terminal 100.

The memory 160 may store a program for operation of the controller 180 and temporarily store input/output data (for example, a phone book, messages, still images, videos). The memory 160 may store data related to vibrations and sounds of various patterns output during the touch input on the touch screen.

The memory 160 may include at least one type of recording medium of a flash memory type, a hard disk type, a multimedia card micro type, a card type memory (for example, an SI) or XD memory, etc.), a random access memory (RAM), a static RAM (SRAM), a read-only memory (ROM), an electrically erasable programmable read-only memory (EEPROM), a programmable read-only memory (PROM), a magnetic memory, a magnetic disk, or an optical disc. The mobile terminal 100 may operate in relation to a web storage that performs a storage function of the memory 160 on the internet.

The interface unit 170 plays a role of passage with all external devices connected to the mobile terminal 100. The interface unit 170 receives data from the external devices, receives power and delivers the power to each element inside the mobile terminal 100, or allows data inside the mobile terminal 100 to be transmitted to the external devices. The interface unit 170 may include, for example, a wired/wireless headset port, an external charging port, a wired/wireless data port, a memory card port, a port connecting a device having an identification module therein, an audio input/output (I/O) port, a video I/O port, an earphone port, etc.

The identification module is a chip storing various types of information for authenticating use authority of the mobile terminal 100, and may include a user identity module (UIM), a subscriber identity module (SIM), or a universal subscriber identity module (USIM), etc. The device having the identification module therein (hereinafter, referred to as 'identification device') may be manufactured in a smart card format. Accordingly, the identification device may be connected to the mobile terminal through a port.

The interface unit 170 may be a passage through which, when the mobile terminal is connected to an external cradle, power is supplied from the cradle to the mobile terminal 100, or various command signals input through the cradle by the user are delivered to the mobile terminal 100. The various command signals input from the cradle or the power may operate as a signal for recognizing that the mobile terminal 170 is exactly mounted to the cradle.

The controller 180 typically controls overall operations of the mobile terminal 100. For example, controls and processes related to a voice call, data communication, or a video call are performed. The controller 180 can include a multimedia module 181 for multimedia playback. The multimedia module 181 may be implemented inside the controller 180 or separately from the controller 180. The controller 180 can perform pattern recognition processing for recognizing a hand-written input or drawing input performed on the touch screen as a letter and an image respectively.

The power supply unit 190 receives external power and internal power under a control of the controller 180 and supplies power needed for operating each element. Various embodiment of the present inventions described herein may be realized on a computer or similar device readable recording medium by using software, hardware, or a combination thereof.

According to hardware realization, embodiment of the present inventions described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electrical units for performing other functions. In some cases, those embodiments of the present invention may be implemented by the controller 180.

According to software realization, embodiment of the present invention such as processes or functions may be implemented with a separate software module allowing at least one function or operation to be performed. The software code may be implemented by a software application written in a proper program language. The software code may be stored in the memory 160 and performed by the controller 180.

Figure 2:
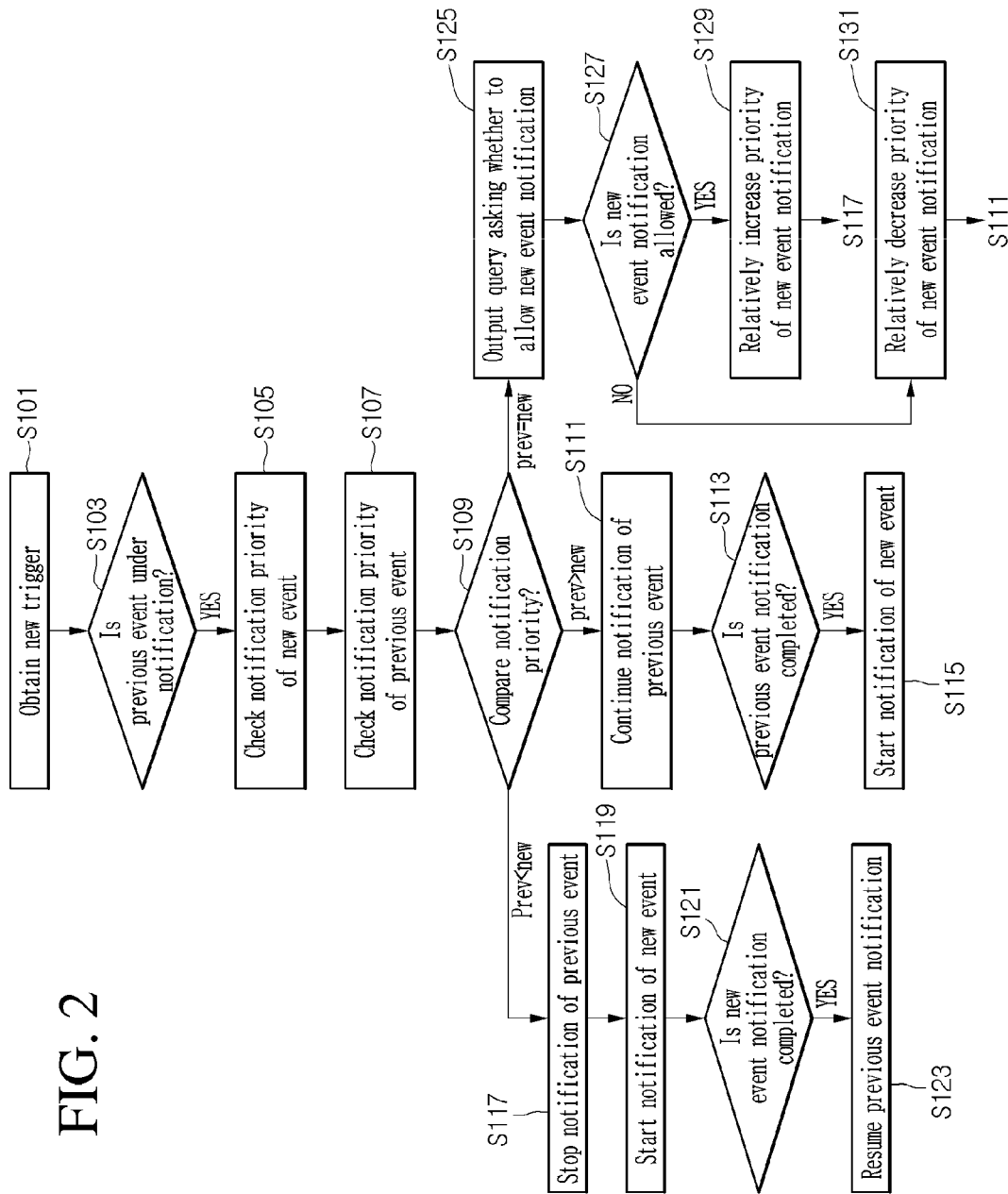
FIG. 2 is a flowchart illustrating an operating method of a terminal according to an embodiment of the present invention.

Next, FIG. 2 is a flowchart illustrating a terminal operating method according to the embodiment of the present invention. When obtaining a new event trigger that notification is necessary (S101), the controller 180 confirms whether a previous event other than an event corresponding to the new event trigger is under notification (S103). When obtaining a new event trigger that voice notification is needed, the controller 180 can also confirm whether a previous event other than the new event trigger is under voice notification.

While the previous event is under notification, the controller 180 checks a notification priority of the new event (S105), and checks a notification priority of the previous event (S107). When the previous event is under voice notification, the controller 180 can check the voice notification priorities of the new and previous events. When the previous event is not under notification, the controller 180 can start notification of the new event.

The controller 180 compares notification priorities of the previous and new events (S109). Further, the controller 180 can compare voice notification priorities of the previous and new events. When the previous event has a higher notification priority than the new event, the controller 180 continues the notification of the previous event (S111). Further, when the previous event has a higher voice notification priority than the new event, the controller 180 can continue the voice notification of the previous event.

When the notification of the previous event is completed (S113), the controller 180 performs notification of the new event (S115). In an embodiment of the present invention, when the voice notification of the previous event is completed, the controller 180 can perform the voice notification of the new event.

When the previous event has a lower notification priority than the new event, the controller 180 stops the notification of the previous event (S117), and notifies the new event (S119). In an embodiment of the present invention, when the previous event has a lower voice notification priority than the new event, the controller 180 can stop the voice notification of the previous event and perform the voice notification of the new event.

When the new event notification is completed (S121), the controller 180 resumes the stopped notification of the previous event (S123). When the voice notification of the new event is completed, the controller 180 resumes the stopped voice notification of the previous event.

When the notification priority of the previous event is identical to that of the new event, the controller 180 outputs a query asking whether to allow the notification of the new event (S125). When the voice notification priority of the previous event is identical to that of the new event, the controller 180 can output a query asking whether to allow the voice notification of the new event. Further, the query may include at least one of a visual query, an auditory query, and a tactile query.

The controller 180 obtains a user input whether to allow the notification of the new event through this query (S127). The controller 180 can obtain a user input whether to allow the voice notification of the new event through this query.

When the user input corresponds to allowance of the notification of the new event, the controller 180 relatively raises a notification priority of the new event in relation to the notification priority of the previous event (S129). When the user input corresponds to allowance of the voice notification of the new event, the controller 180 can relatively raise the voice notification priority of the new event in relation to the voice notification priority of the previous event. Further, the controller 180 can never change the priorities of the previous event and the new event. That is even when the controller 180 relatively raises the priorities of the previous and new events, the priorities of the previous and new events may not be changed in relation to a priority of a third event.

Thereafter, the controller 180 stops the notification of the previous event (S117), and the new event is notified (S119). The controller 180 can stop the voice notification of the previous event, and the voice notification of the new event is performed.

When the notification of the new event is completed (S121), the controller 180 resumes the stopped notification of the previous event (S123). When the voice notification of the new event is completed, the controller 180 can resume the stopped voice notification of the previous event.

When a user input corresponding to disallowance of the new event notification is obtained, the controller 180 relatively lowers the priority of the new event in relation to the notification priority of the previous event (S131). When a user input corresponding to disallowance of the voice of the new event is obtained, the controller 180 can relatively lower the voice priority of the new event in relation to the voice notification priority of the previous event. Further, the controller 180 can never change priorities of the previous and new events. That is, even when the controller 180 relatively lower the priorities of the previous and new events, the priorities of the previous and new events may not be changed in relation to a priority of a third event.

The controller 180 can manage relative priorities of events by using relative priority table as shown in Table 3.

TABLE 3

|  | Low battery event | Alarm event | Message arrival event | Incoming call event | Missed call event |
|---|---|---|---|---|---|
| Low battery event | — | A | A | B | B |
| Alarm event | A | — | B | A | B |
| Message arrival event | A | B | — | B | B |
| Incoming call event | B | A | A | — | A |
| Missed call event | B | B | A | A | — |

In Table 3, a plurality of events written vertically represent previous events, a plurality of event written horizontally represent new events, A denotes that a previous event has a priority, and B denotes that a new event has a priority.

When a user input corresponding to allowance of the new event is obtained more frequently than the predetermined number of times, the controller 180 can relatively raise the priority of the new event in relation to the priority of the previous event. For example, when the user input corresponding to allowance of the new event notification is obtained 5 times, the controller 180 can relatively raise the priority of the new event in relation to the priority of the previous event.

When a user input corresponding to disallowance of the new event is obtained more frequently than the predetermined number of times, the controller 180 can relatively lower the priority of the new event in relation to the priority of the previous event. For example, when the user input corresponding to disallowance of the new event notification is obtained 5 times, the controller 180 can relatively lower the priority of the new event in relation to the priority of the previous event.

For this, the controller 180 can manage the relative priorities of the events by using a relative priority table as shown in Table 4.

TABLE 4

|  | Low battery event | Alarm event | Message arrival event | Incoming call event | Missed call event |
|---|---|---|---|---|---|
| Low battery event | 0 | 1 | −2 | 3 | 4 |

TABLE 4-continued

|  | Low battery event | Alarm event | Message arrival event | Incoming call event | Missed call event |
|---|---|---|---|---|---|
| Alarm event | −1 | 0 | 5 | −4 | 5 |
| Message arrival event | −5 | 5 | 0 | −5 | 2 |
| Incoming call event | 3 | −4 | −2 | 0 | −3 |
| Missed call event | −2 | −5 | −3 | −5 | 0 |

In Table 4, the numbers represent the number of times that a user input corresponding to allowance of the new event notification and a user input corresponding to disallowance of the new event notification. When the user input corresponding to allowance of the new event notification is obtained, the corresponding number may increase, and when the user input corresponding to disallowance of the new event notification in obtained, the corresponding number may decrease.

Thereafter, the controller 180 continues the notification of the previous event (S111). In an embodiment of the present invention, the controller 180 can continue the voice notification of the previous event.

When the previous event notification is completed (S113), the controller 180 notifies the new event (S115). When the voice notification of the previous event is completed, the controller 180 can perform the voice notification of the new event.

Figure 3:
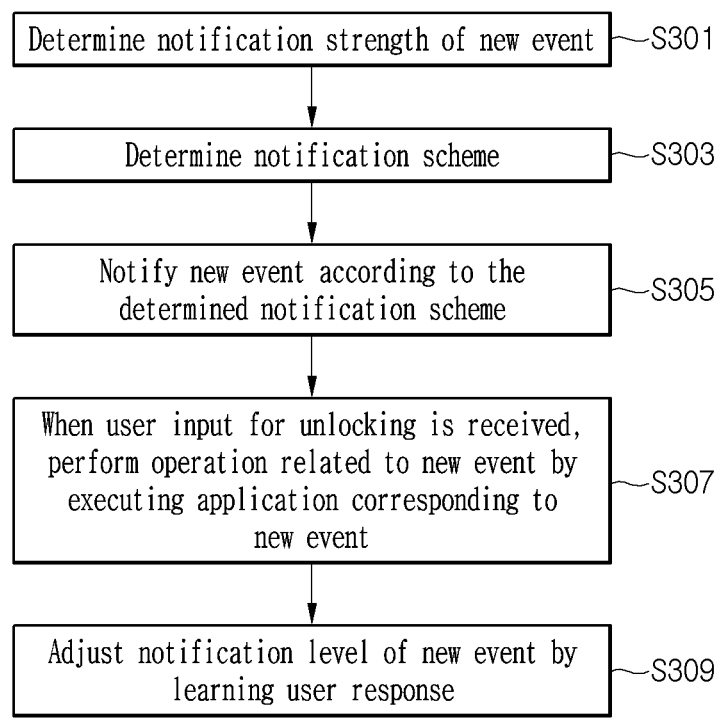
FIG. 3 is a flowchart illustrating a method of adjusting an event notification level of a terminal according to an embodiment of the present invention.

Description about an event notification method of a terminal according to an embodiment of the present invention is provided below with reference to FIG. 3. In particular, FIG. 3 is a flowchart illustrating an event notification method of a terminal according to an embodiment of the present invention.

The controller 180 determines a notification strength of the new event (S301). The controller 180 can determine a voice notification strength of the new event. The controller 180 can determine a notification strength of the new event using a notification level allocated to the new event. When the notification level and notification strength have respectively 3 levels, the notification strength may be determined as shown in Table 5.

TABLE 5

| Notification level of an event | Notification strength |
|---|---|
| 1 | 1 |
| 2 | 2 |
| 3 | 3 |

In addition, the controller 180 can determine a notification strength of the new event by using importance information allocated to an event trigger. Further, the importance information may include a notification level. When the notification level and the notification strength respectively have 3 levels, the notification strength may be determined as shown in Table 6.

TABLE 6

| Notification level of an event trigger | Notification strength |
|---|---|
| 1 | 1 |
| 2 | 2 |
| 3 | 3 |

In addition, the controller 180 can determine the notification strength of the new event by using the importance information allocated to the event trigger and the notification level allocated to the new event. Further, the importance information may include the notification level. When the notification level and the notification strength respectively have 3 levels, the notification strength may be determined as shown in Table 7.

TABLE 7

| Notification level of an event | Notification level of an event trigger | Sum of two notification levels | Notification strength |
|---|---|---|---|
| 1 | 1 | 2 | 1 |
| 1 | 2 | 3 | 1 |
| 2 | 1 | 3 | 1 |
| 1 | 3 | 4 | 2 |
| 2 | 2 | 4 | 2 |
| 3 | 1 | 4 | 2 |
| 2 | 3 | 5 | 3 |
| 3 | 2 | 5 | 3 |
| 3 | 3 | 6 | 3 |

In table 7, the event notification level represents how important the corresponding event is considered by the terminal, and the importance of the event trigger represents how strongly the event trigger itself needs to be notified. The event notification level may be updated according to user learning, and the importance of the event trigger may be irrelative to the user learning.

For example, the terminal may set a notification level of a contact number A to 2, and a notification level of a contact number B to 3. Further, when a message of importance 3 arrives from the contact number A, since the notification level of the contact number A is 2, the terminal can notify the arrival of the message with notification strength 3. Furthermore, when a message of importance 2 arrives from a contact number B, since the notification level of the contact number B is 3, the terminal can notify the arrival of the message with identical notification strength 3.

In a low battery event, the importance information of the event trigger may represent how much a remnant amount of the battery is smaller than a reference value. In an alarm event, the importance information of the event trigger may represent how close a current time approach an alarm time of the alarm event.

In a message arrival event, the importance information of the event trigger may represent how an important message arrives. Description about this will be provided with reference to FIGS. 18 and 19. In an incoming call event, the importance information of the event trigger may represent how important an incoming call arrives.

In a missed call event, the importance information of the event trigger may represent how many missed calls are made from the same other party. In a low call signal strength event, the importance information of the event trigger may represent how much the call signal strength is lower than a reference value.

In a news event, the importance information of the event trigger may represent how important news is received. In a weather event, the importance information of the event trigger may represent how important weather information is received. In a schedule reach event, the importance information of the event trigger may represent how close a current time is to the scheduled time of a schedule event.

In a high terminal temperature event, the importance information of the event trigger may represent how much higher the terminal temperature is than a reference value. In a low Wi-Fi signal strength event, the importance information of the event trigger may represent how much lower the Wi-Fi signal strength is than a reference value.

In a low DMB signal strength event, the importance information of the event trigger may represent how much lower DMB signal strength is than a reference value. In a data remnant amount event, the importance information of the event trigger may represent how much a data amount to be used remains.

The notification level may be allocated to an event, and may be updated according user learning of the user's reaction. By default, the lowest notification level may be allocated to an incoming call event from a user who is not registered to an address book, and a higher notification level (for example, notification level 2 or the highest notification level) may be allocated to an incoming call from a user registered to the address book. Then, the notification level may be increased for an incoming call from a user to whom calls are frequently made or a user who frequently makes a call or a reply.

The controller 180 determines a notification type according the determined notification strength (S303). In an embodiment of the present invention, the controller 180 can determine a voice notification scheme according to the determined voice notification strength.

In addition, the controller 180 can determine whether to use voice notification as a notification scheme according to the notification strength. For example, when the notification strength is lower than a reference value, the controller 180 does not use the voice notification as the notification scheme. When the notification strength is higher than a reference value, the controller 180 can use the voice notification as the notification scheme.

When the voice notification is used as the notification scheme, the controller 180 can differentiate an audio volume of the voice notification according to the notification strength. For example, the stronger the notification strength is, the more an amount of the voice volume is.

When the voice notification is used as the notification scheme, the controller 180 can differentiate an amount of content of the voice notification according to the notification strength. For example, the stronger the notification strength is, the more an amount of the content of the voice notification is. As the notification strength is higher, the controller 180 can further specify content of the voice notification.

When the voice notification is used as a notification scheme, the controller 180 can differentiate the number of repetition times of content of the voice according to the notification strength. For example, as the notification strength is higher, the number of repetition times of the content of the voice may be greater.

When the voice notification is used as a notification scheme, the controller 180 can differentiate a voice tone of the voice according to the notification strength. For example, as the notification strength is higher, the voice tone for the voice may be higher, which may attract user attention.

In addition, the controller 180 can determine whether to use sound notification as a notification scheme according to the notification strength. For example, when the notification strength is lower than a reference value, the controller 180 does not use the sound notification as the notification scheme. When the notification strength is greater than the reference value, the controller 180 can use sound notification as the notification scheme.

When the sound notification is used as the notification scheme, the controller 180 can differentiate an audio volume of the sound notification according to the notification strength. For example, as the notification strength is greater, the audio volume of the sound notification may be greater When the sound notification is used as the notification scheme, the controller 180 can differentiate the number of repetition times of sound according to the notification strength. For example, as the notification strength is greater, the number of repetition times of the sound may be greater.

In addition, the controller 180 can determine whether to use vibration notification as a notification scheme according to notification strength. For example, when the notification strength is lower than a reference value, the controller 180 does not use the vibration notification as the notification scheme. When the notification strength is higher than the reference value, the controller 180 can use the vibration notification as the notification scheme.

When the vibration notification is used as the notification scheme, the controller 180 can differentiate strength of vibration according to the notification strength. For example, as the notification strength is greater, the vibration strength may be greater.

When the vibration notification is used as the notification scheme, the controller 180 can differentiate a vibration pattern according to the notification strength. For example, as the notification strength is greater, the irregularity of the vibration pattern may be greater, which attracts user attention.

When the vibration notification is used as the notification scheme, the controller 180 can differentiate the number of repetitions of a vibration pattern. For example, as the notification strength is greater, the number of repetitions of the vibration pattern may be greater.

When the vibration notification is used as the notification scheme, the controller 180 can differentiate the duration of vibration according to the notification strength. For example, as the notification strength is greater, the duration of vibration may be longer.

In addition, the controller 180 can determine, as a notification scheme, whether to use GUI notification according to notification strength. For example, when the notification strength is lower than a reference value, the controller 180 does not use the GUI notification as the notification scheme. When the notification strength is higher than a reference value, the controller 180 can use the GUI notification as the notification scheme.

When the GUI notification is used as the notification scheme, the controller 180 can differentiate a type of a GUI element according to the notification strength. The GUI element type may represent a notification icon displayed on the top portion of the display unit 151, a popup window displayed on the center of the display unit 151, and an application controlling notification stop. For example, in an alarm event, as an application for controlling the notification stop, a quiz application may be used which controls an alarm to stop. When the terminal starts to notify the alarm event and executes the quiz application, the notification may not be stopped until a user answers quizzes provided by the quiz application. When the user answers the quizzes, the notification may be stopped.

When the GUI notification is used as a notification scheme, the controller 180 can differentiate the size of a GUI element. For example, as the notification strength is greater, the size of the GUI element may be greater.

When the GUI notification is used as a notification scheme, the controller 180 can differentiate the color of the GUI element. For example, as the notification strength is greater, the color for allowing the GUI element to be more visually noticeable may be used.

In addition, the controller 180 can determine, as a notification scheme according to the notification strength, whether to use another terminal notification which is notification through another terminal. For example, when the notification strength is lower than a reference value, the controller 180 does not use another terminal notification as the notification scheme. When the notification strength is higher than a reference value, the controller 180 can use another terminal notification as the notification scheme.

When another terminal notification is used as the notification scheme, the controller 180 can differentiate a kind of another terminal performing the event notification or the voice notification according to the notification strength as represented in Table 8.

TABLE 8

| Notification strength | First embodiment of the present invention of a kind of another terminal |
|---|---|
| 1 | Terminal that obtains an event |
| 2 | Terminal that obtains an event + wearable terminal |
| 3 | Terminal that obtains an event + wearable terminal + mobile terminal (phone, tablet, notebook computer etc.) |
| 4 | Terminal that obtains an event + wearable terminal + mobile terminal (phone, tablet, etc.) + fixed terminal (TV, desktop computer, etc.) |

In various embodiments of the present invention, the type of other terminal performing the event notification or the voice notification may be changed according to a combination of the terminal that obtains an event, a wearable terminal, a mobile terminal, and a fixed terminal.

Further, the type of another terminal performing the event notification or the voice notification may be limited to another terminal belonging to a user of the terminal that obtains an event. The type of other terminal performing the event notification or the voice notification may be limited to another terminal registered to the terminal that obtains an event.

In addition, the controller 180 can determine, as a notification scheme according to the notification strength, a notification time as one of instant notification and regular notification. For example, when the notification strength is lower than a reference value, the controller 180 can determine the notification time as the regular notification. When the notification strength is higher than the reference value, the controller 180 can determine the notification time as the instant notification.

As shown in Table 9, the above-described various notification schemes may be combined. That is, the controller 180 can determine the notification scheme according to the notification strength by combining whether to use the voice notification, adjustment of an audio volume of the voice notification, adjustment of a content amount of the voice notification, or whether to use vibration notification, etc.

TABLE 9

| Notification strength | 1 | 2 | 3 |
|---|---|---|---|
| Low battery event | Audio volume level 1 + voice repetition X1 | Audio volume level 2 + voice repetition X2 | Audio volume level 3 + voice repetition X3 + vibration notification |
| Missed call event | Audio volume level 1 + voice content "missed call" | Audio volume level 2 + voice content "N missed calls" | Audio volume level 3 + vibration notification + voice content "missed call from [user A], missed call from [user B]" |
| Message arrival event | Audio volume level 1 + voice content "message" | Audio volume level 2 + voice content "message arrived from [user A]" | Audio volume level 3 + vibration notification + voice content "message arrived from [user A], message arrived from [user B]" |
| Schedule reach event | Audio volume level 1 + voice content "schedule" | Audio volume level 2 + voice content "schedule for [theme] at [time]" | Audio volume level 3 + vibration notification + voice content "schedule for [theme] at [time] {first sentence of content of schedule}" |
| News event | Regular notification + voice content "[section] [title of article]" | instant notification + voice content "[section] [title of article] {first sentence of article}" | instant notification + voice content "[section] [title of article] {overall content of article}" |

Further, when a notification scheme is designated in an event trigger, the controller 180 can determine a final notification scheme with reference to the notification strength and the notification scheme designated in the event trigger.

The controller 180 notifies a new event according to the determined notification scheme (S305). The controller 180 can perform voice notification of the new event according to the determined voice notification scheme.

In particular, the controller 180 can perform the voice notification of the new event by performing text-to-speech conversion. When an event trigger has a text, the controller 180 can convert the text of the event trigger into speech and perform the voice notification. When the event trigger does not have the text, the controller 180 searches the memory 160 for the text corresponding to the event trigger, converts the searched text into speech, and performs the voice notification.

In addition, the controller 180 can convert a text from a combination of at least two of announcement designated for the event trigger, information about the event trigger, and a text in the event trigger into speech, and perform the voice notification. In the text within quotation marks (" ") of Table 8, square brackets ([ ]) represent information about the event trigger, braces ({ }) represent a text within the event trigger, and other text represent designated announcement.

In an embodiment of the present invention, it is assumed that the controller 180 obtains an event trigger corresponding to a weather message, and the weather message includes information about current temperature, current humidity, maximum temperature of today, and tomorrow's weather. Further, the content of the voice content would be as below.

"Hi, good morning. Current temperature is {current temperature}, current humidity is [current humidity], and today's maximum temperature is [today's maximum temperature]. Tomorrow's weather is expected to be [tomorrow's weather]."

In order to perform text-to-speech conversion, the controller 180 can use a predetermined voice. In more detail, in order to perform text-to-speech conversion, the controller 180 can use a voice set for a new event. In addition, in order to perform text-to-speech conversion, the controller 180 can use a voice set for a function or application to which the new event belongs.

Voice setting corresponding to a function may be changed. The change of the voice corresponding to the function will be described later. When receiving a user input for unlocking the terminal 100 during notification of the new event, the controller 180 performs an operation related to the new event by executing an application corresponding to the new event (S307), although the application corresponding to the new event is not separately executed. Further, an example of the operation related to the new event may include a phone call, a display of a news message, a display of a weather message, various warnings, or Bluetooth pairing.

Thereafter, the controller 180 learns the user's reaction and adjusts a notification level of the new event (S309). The controller 180 can adjust the notification level based on the user's reaction during the notification of the new event, after the notification of the new event, or all of during the notification of the new event and after the notification of the new event.

Table 10 shows an example of notification level adjustment according to learning the user's reaction.

TABLE 10

| Kind of event | Increase notification level | Decrease notification level |
|---|---|---|
| Low battery event | When a user charges a battery after confirming the speech briefing | When a user ends the speech briefing |

TABLE 10-continued

| Kind of event | Increase notification level | Decrease notification level |
|---|---|---|
| Incoming call event | 1) when confirming voice and instantly making a call to the other party, 2) when having a call from a user whose call traffic is greater than a reference value, or 3) when having a call from a user whose number of calls is greater than a reference value | 1) when having a call from a phone number which is not registered to an address book, 2) when not responding to an incoming call and ending the call, or 3) when not making a call to the other party despite confirming a missed call event |
| Message arrival event | When confirming voice and instantly confirming a message, or confirming voice and transmitting a response message | When a message from a user who is not registered arrives, or when confirming voice and instantly deleting the message or when the voice is neglected |
| Schedule reach event | When reaching a schedule including designated keywords (birthday, task, reply, meeting, etc.) | When reaching a schedule which does not include designated keywords, or ending speech briefing |
| News event | When receiving a news including designated keywords (breaking news, user designated keywords) or receiving news of which approaching frequency by users is high | When receiving news of which approaching frequency by users is low |
| Weather event | When weather change is relatively large or weather a breaking news (heat wave, heavy rain, heavy snow) occurs | When weather change is not relatively large |
| SNS event | When a content access ratio by a specific user increases or a content item related to a high rank keyword in keyword ranking occurs | When a content access ratio by a specific user decreases |

In particular, in relation to an incoming call event, when detecting that a user confirms and instantly makes a call, the controller 180 can increase the notification level of the incoming call event from a corresponding other party.

In addition, when detecting that a user has a call from the other party whose individual call traffic is higher than a reference value, the controller 180 can increase the notification level of the incoming call event from the corresponding other party. Further, the controller 180 can detect that an incoming call is from another party whose individual call traffic over entire call traffic is greater than a reference value. For example, the reference value may be set as 10%.

Furthermore, when detecting that a user has a call from another party whose number of calls is greater than a reference value, the controller 180 can increase the notification level of the incoming call event from the corresponding other party. Further, the controller 180 can detect that an incoming call is from another party whose individual number of calls over entire number of calls is greater than a reference value. The reference value may be set as 10%.

Figure 4:
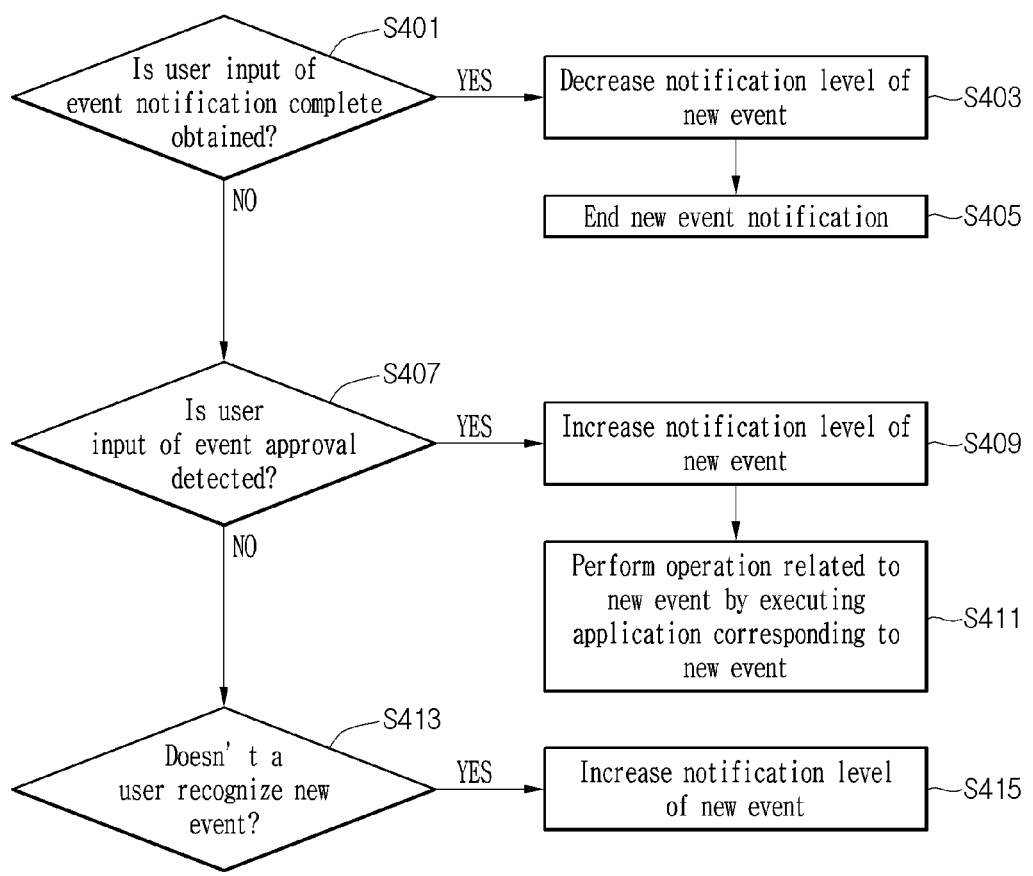
FIG. 4 is a flowchart illustrating a method of adjusting the event notification level of a terminal.

Next, a method of adjusting an event notification level of a terminal according to an embodiment of the present invention is described with reference to FIG. 4. In particular, FIG. 4 is a flowchart illustrating a method of adjusting the event notification level of a terminal according to an embodiment of the present invention.

When a user input for event rejection (or event notification end) during notification of a new event is obtained (S401), this may represent that a user recognizes the new event but has low interest in the new event. Then, the controller 190 decreases a notification level of the new event for a next notification of the new event (S403) and ends the notification of the new event (S405). When a user input for ending voice notification is obtained during the voice notification of a new event, the controller 180 can reduce a voice notification level of the new event and end the voice notification of the new event for a next voice notification of the new event.

When a rejection count for the new event is greater than a reference rejection count, the controller 180 can decrease the notification level of the new event and reset the rejection count for the new event.

As shown in Table 11, the new event may request a user's reaction.

TABLE 11

| Application | Registered event (or event) | Requested user's reaction |
|---|---|---|
| Battery | Low battery event | Charging |
| Alarm | Alarm event | Alarm end |
| Message | Message arrival event | Message confirmation |
| Call | Incoming call event | Call acceptance |
| Call | Missed call event | Missed call confirmation or attempt to make a call to the other party corresponding to the missed call |
| Call | Low call signal strength event | Call signal strength confirmation |
| News | News event | News confirmation |
| Weather | Weather event | Schedule confirmation |
| Schedule | Schedule reach event | Use amount decrease of a terminal |
| Terminal temperature | High terminal temperature event | Wi-Fi signal strength confirmation |
| Wi-Fi | Low Wi-Fi signal strength event | DMB signal strength confirmation |
| DMB | Low DMB signal strength event | Pairing acceptance |
| Bluetooth | Bluetooth pairing request event | |

For the new event notification, when detecting a user input (user's reaction that a new event requests) for an event approval (S407), since this may represent that the user recognizes the new event and has large interest in the new event, the controller 180 increases a notification level of the new event for a next notification of the new event (S409). When detecting a user's reaction that the new event requests, the controller 180 can increase a voice notification level of the new event for next voice notification of the new event.

When a count of the user's reaction that the new event requests is greater than a reference count of the user's reaction, the controller 180 can increase the notification level of the new event and reset the count of user's reaction that the new event requests.

When detecting a user input for approval of a new event, although an application corresponding to the new event is not executed, the controller 180 performs an operation related to the new event by executing the application corresponding to the new event (S411). Further, an example of the operation related to the new event includes a phone call, a display of a news message, a display of a weather message, various warnings, or Bluetooth pairing.

Further, when a user input corresponding to an event notification end or a user's reaction that the new event requests is not detected, the controller 180 determines that the user does not recognize the new event.

When the controller 180 determines that the user does not recognize the new event (S413), since the new event is necessary to be notified stronger, the controller 180 increases the notification level of the new event for a next notification of the new event (S415). When the controller 180 determines that the user does not recognize the new event, the controller 180 can increase the voice notification level of the new event for a next voice notification of the new event.

When a count that a user does not recognize a new event is greater than a reference non-recognition count, the controller 180 can increase a notification level of the new event and reset the count that the user does not recognize the new event.

The reference count such as the reference rejection count, the reference user's reaction count, or the reference non-recognition count may be a constant value regardless of the notification level, or variable according to the notification level. For example, reference counts for notification level 1, 2, and 3 may be respectively 1, 2, and 3. A reference count value may be increased according to an increase of the notification level or decreased according to an increase of the notification level.

In the above-described embodiments of the present invention, when the event trigger occurs, an event is notified and then an event notification level is changed. However, when the event trigger occurs, the controller 180 can adjust the event notification level based on the repetition of the event trigger, notify the event, and then readjust the event notification level based on a user's reaction to the event.

Next, a method of changing a notification priority according to an embodiment of the present invention is described with reference to FIG. 5. In particular, FIG. 5 includes display screens showing a method of changing a notification priority according to an embodiment of the present invention.

Figure 5:
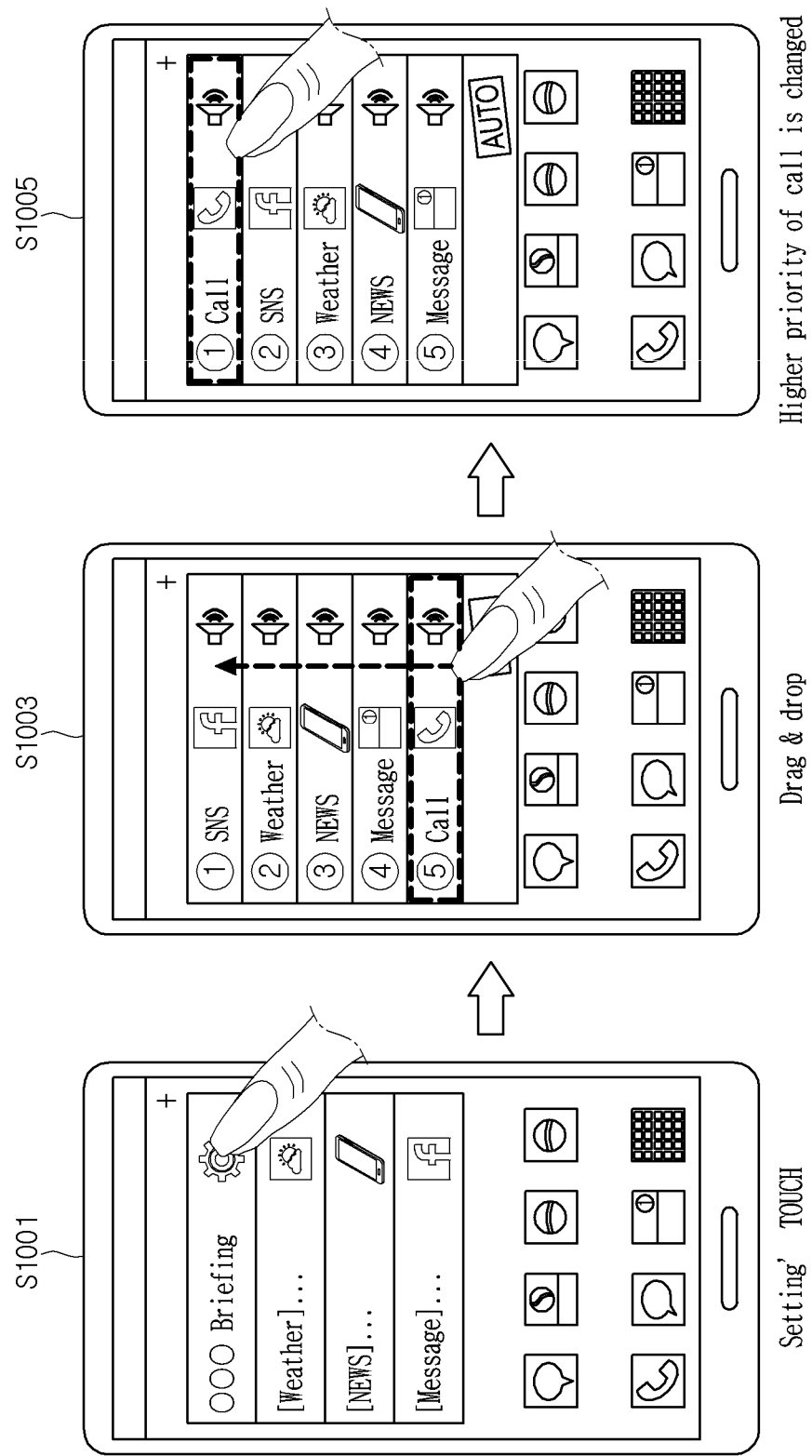
FIG. 5 includes display screens illustrating a notification priority change method according to an embodiment of the present invention.

In FIG. 5, the event notification priority corresponds to an application notification priority to which the event belongs. As shown in FIG. 5, when obtaining a user input corresponding to an entrance into a voice setting menu (in more detail, a user input corresponding to the entrance into a notification priority setting menu) (S1001), the controller 180 displays a list including a plurality of functions (a plurality of applications) arranged according to the notification priority (S1003). Further, the user input corresponding to the entrance into the voice setting menu may be a touch on an item like an icon corresponding to the entrance into the corresponding setting menu.

When obtaining a user input corresponding to a notification priority change, the controller 180 changes the notification priority (S1005). Further, when obtaining a user input corresponding to a notification priority change of a function, the controller 180 can change the notification priority of the function. A user input corresponding to a notification priority change of a function may be a touch input that drags and drops the function (application).

In particular, FIG. 5 pertains to a priority change of a voice notification of a call. When a user selects an item corresponding to entrance into the notification priority setting menu, the controller 180 shows or displays, as a list, a plurality of applications registered to a current voice list. When the user drags a call item and drops it to a desired priority, the controller 180 changes the voice notification priority of a call application into the priority corresponding to the corresponding position. Referring to FIG. 5, high voice notification priorities are allocated in order of a call application, an SNS application, a weather application, a news application, and a message application.

FIG. 5 illustrates an embodiment of the present invention that a user manually changes the notification priority, but FIG. 5 can also be applied to a manual notification level change by a user.

Next, a method of setting a voice to a function according to an embodiment of the present invention is described with reference to FIG. 6. In particular, FIG. 6 illustrates a change of the graphic user interface showing a method of setting a voice to a function according to an embodiment of the present invention.

Figure 6:
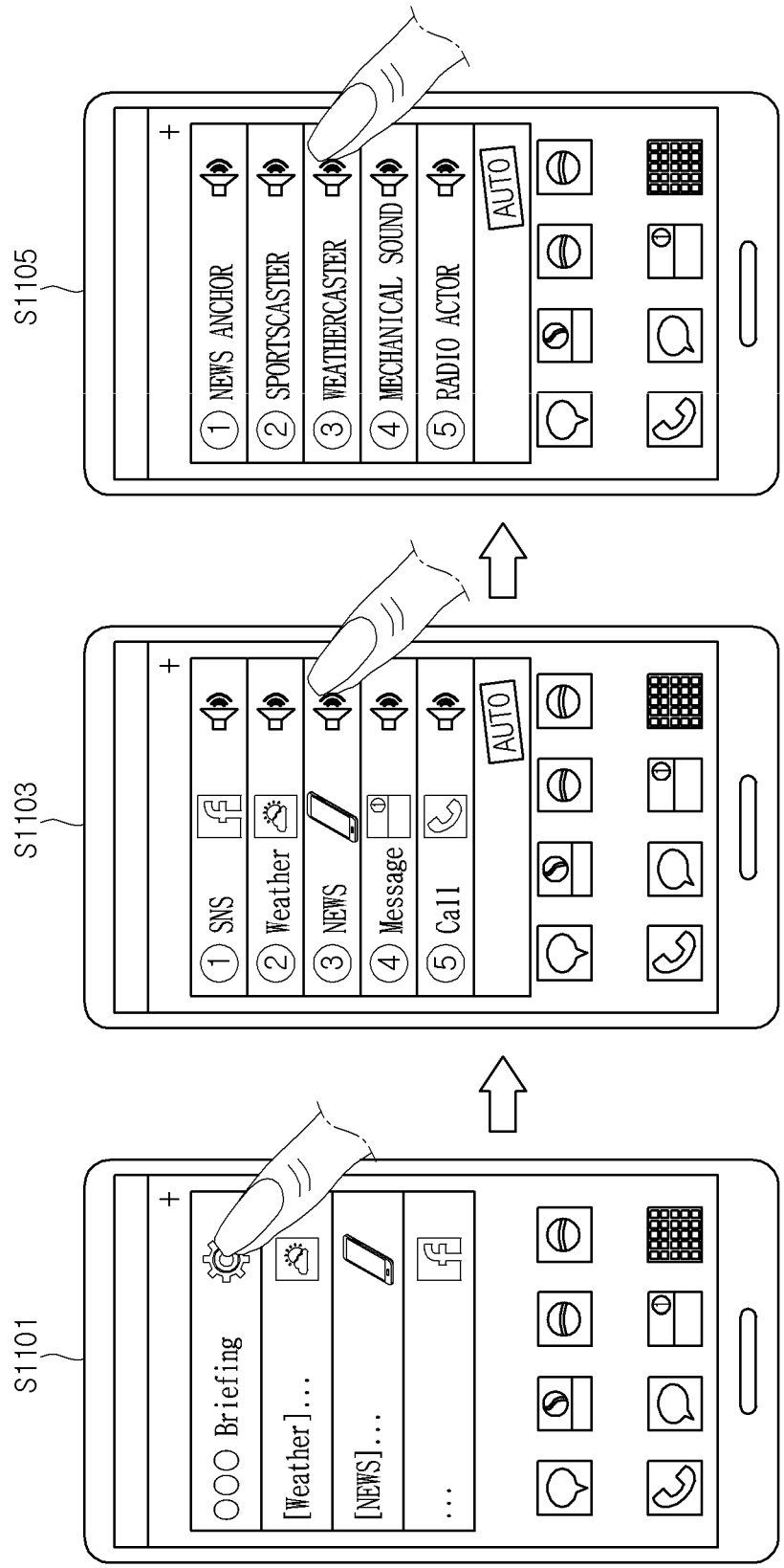
FIG. 6 includes display screens illustrating a method of setting a voice in a function according to an embodiment of the present invention.

As shown in FIG. 6, when obtaining a user input corresponding to entrance into the voice setting menu (S1101), the controller 180 displays a list including a plurality of functions (a plurality of applications) arranged according to the notification priority (S1103). Further, the user input corresponding to the entrance of the voice setting menu may be a touch on an item like an icon corresponding to the corresponding setting menu entrance.

When obtaining a user input corresponding to voice setting for a function, the controller 180 displays a list which includes a plurality of voices (S1105). Further, when obtaining a user input corresponding to selection of one of the plurality of voices, the controller 180 can set the selected voice to the corresponding function.

As shown in FIG. 6, the user input corresponding to the voice setting for the function may be a touch click on a sound icon button positioned at a right side of a list item corresponding to the corresponding function. The user input corresponding to selection of one of the plurality of voices may be a touch click on one of a plurality of list items for the plurality of voices.

Figure 7:
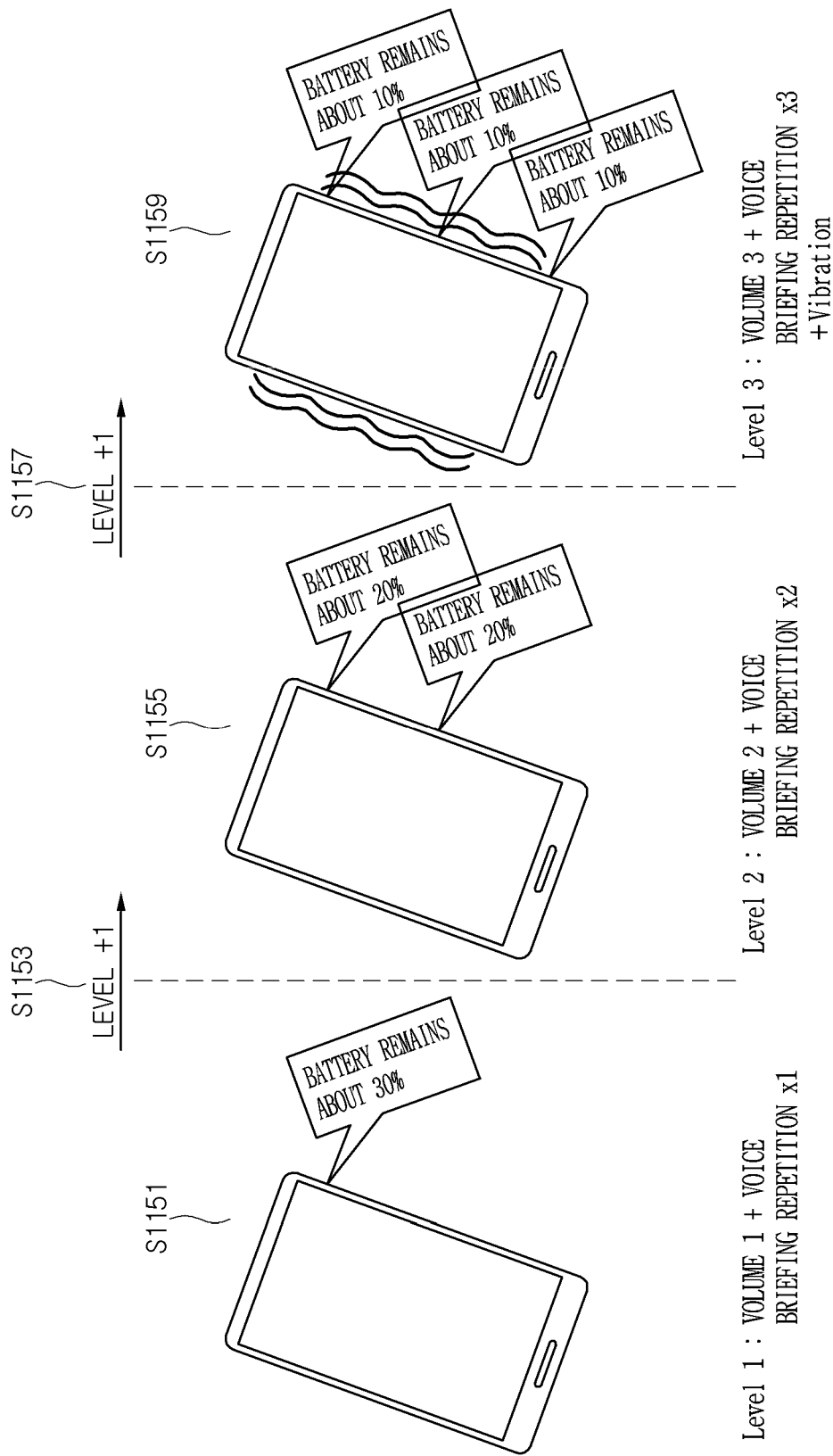
FIG. 7 is an overview illustrating a method of notifying a low battery event according to an embodiment of the present invention.

Next, FIG. 7 illustrates a method of notifying a low battery event according to an embodiment of the present invention. When the battery remains about 30%, the controller 180 notifies a low battery event of notification level 1 (or notification strength 1) (S1151). Further, the controller 180 can notify the low battery event by outputting voice (e.g., speech) once with volume level 1.

When the charging of the battery is not started despite the low battery event notification with notification level 1, the controller 180 increases the notification level by 1 (S1153). When the battery remains about 20%, the controller 180 notifies a low battery event of notification level 2 (or notification strength 2) (S1155). Further, the controller 180 can notify the low battery event by outputting voice twice with volume level 2.

When the charging is not started despite the low battery event notification with notification level 2, the controller 180 increases the notification level by 1 (S1157). When the battery remains about 10%, the controller 180 notifies a low battery event of notification level 3 (or notification strength 3) (S1159). Further, the controller 180 can notify the low battery event by outputting voice three times with volume level 3 while creating vibration.

When a user continues to use the terminal even after neglecting by ending the notification, since the continuous notification may disturb the use of the terminal, the controller 180 can decrease the notification level of the low battery event for a next notification of the low battery event.

For example, when a battery charging notification popup occurs during playing a game, the game playing is disturbed. Therefore, the controller 180 can decrease the notification level of the low battery event for a next notification of the low battery event. Thereafter, the controller 180 can perform a next notification of the low battery event within a range that the game playing is not disturbed. For example, the controller 180 can display a GUI related to the low battery event on a state bar.

Further, when the user charges the terminal three times or more right after the low battery event is notified, the controller 180 can increase the notification level of the low battery event for a next notification of the low battery event.

Figure 8:
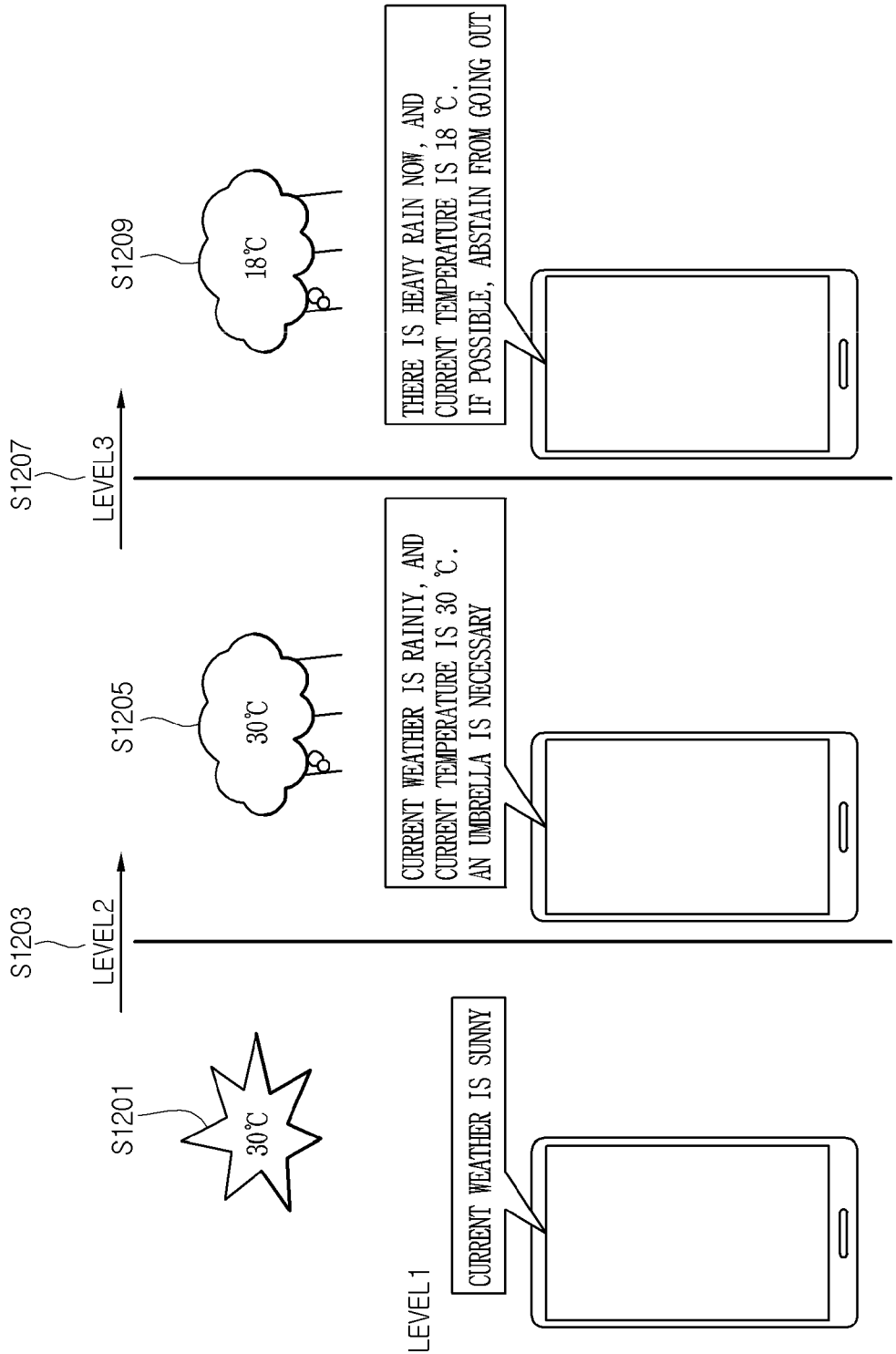
FIG. 8 is an overview illustrating a method of notifying a weather event according to an embodiment of the present invention.

Next, a method of notifying a weather event according to an embodiment of the present invention is described with reference to FIG. 8. In particular, FIG. 8 illustrates a method of notifying a weather event according to an embodiment of the present invention. When obtaining a weather message, the controller 180 notifies the weather event with notification level 1 (or notification strength 1) (S1201). Further, the controller 180 can notify the weather event by outputting voice once with volume level 1.

When obtaining a new weather message, the controller 180 checks whether the weather changes. When the weather changes, the controller 180 increases the notification level by 1 (S1203). Thereafter, the controller 180 notifies the weather event with notification level 2 (or notification strength 2) (S1205). Further, the controller 180 can notify the weather event by outputting voice twice with volume level 2. As described above, content of the voice with notification level 2 may be more specified than that of the voice with notification level 1.

When obtaining a new weather message, the controller 180 checks whether the weather message corresponds to breaking news. When the weather message corresponds to the breaking news, the controller 180 increases the notification level by 1 (S1203).

Thereafter, the controller 180 notifies the weather event with notification level 3 (or notification strength 3) (S1205). Further, the controller 180 can notify the weather event by executing voice three times with volume level 3 and creating vibration. As described above, the content of the voice with notification level 3 may be more specified than that of the voice with notification level 2.

Next, a method of notifying an alarm event according to an embodiment of the present invention is described with reference to FIGS. 9 and 10. In particular, FIGS. 9 and 10 illustrate a method of notifying an alarm event according to an embodiment of the present invention.

Figure 9:
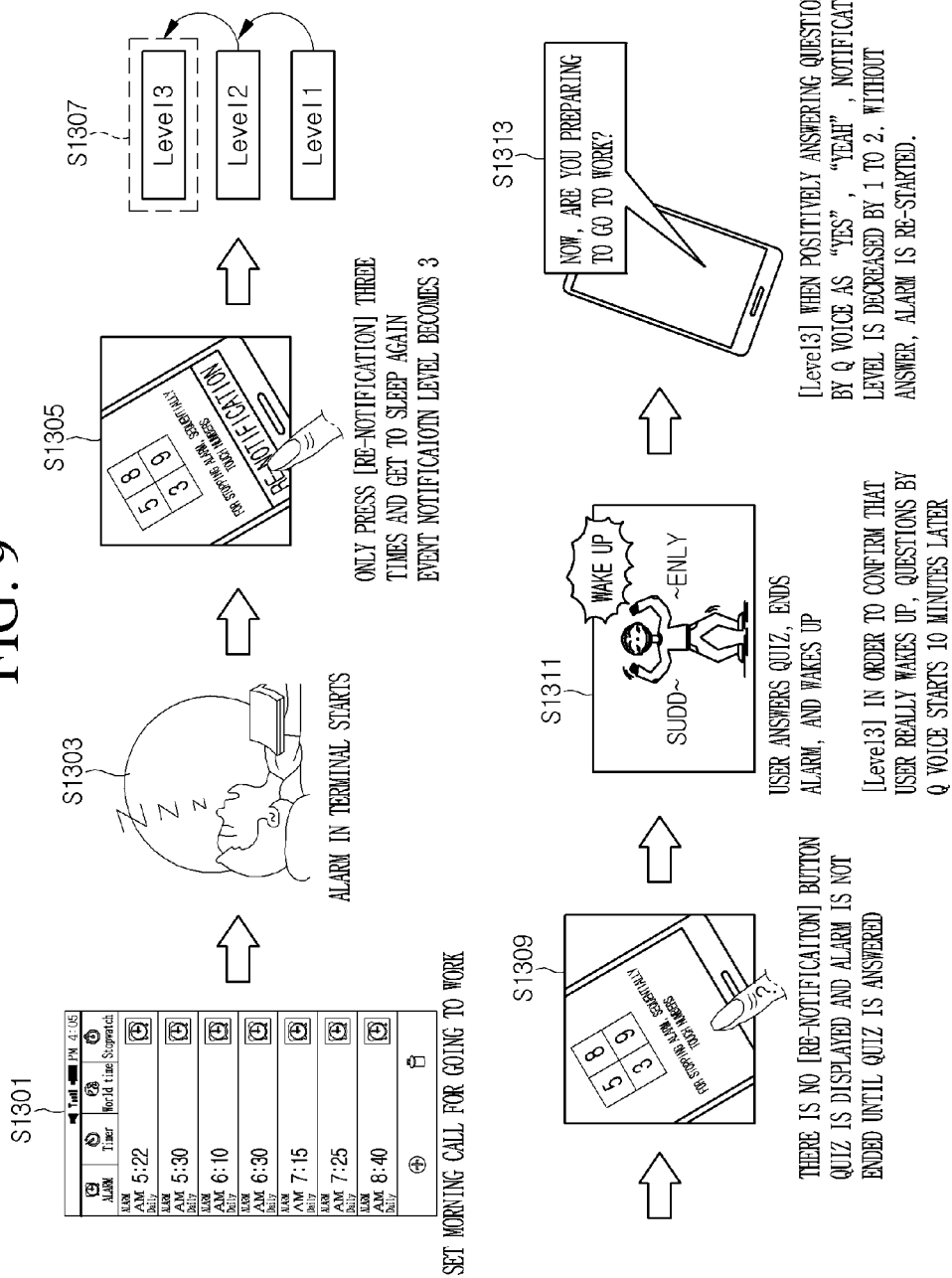
FIGS. 9 and 10 are overviews illustrating a method of notifying an alarm event according to embodiment of the present invention.
Figure 10:
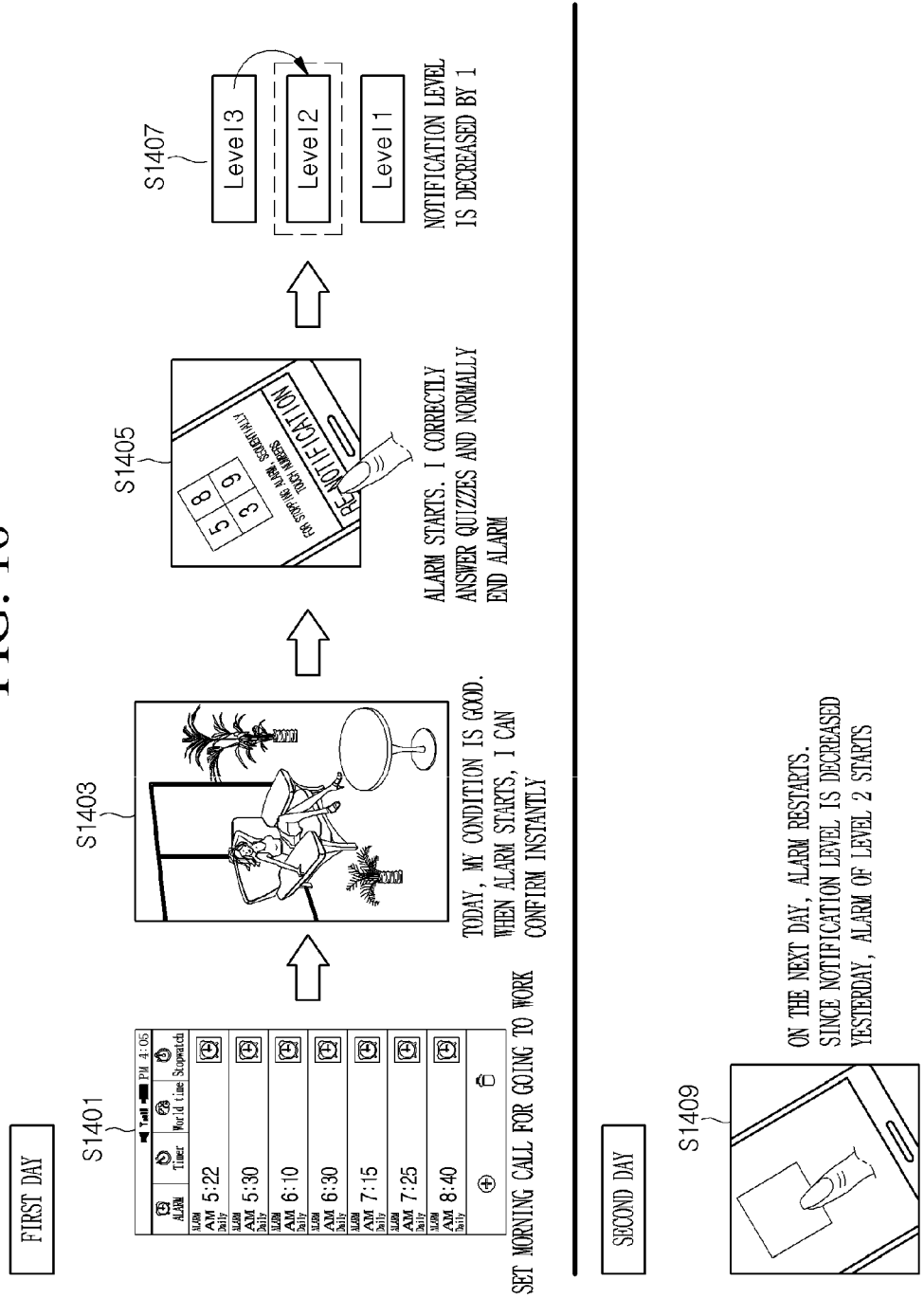

Referring to FIG. 9, when a user sets a morning alarm for work, the controller 180 registers an alarm event based on the morning alarm setting information by the user (S1301). Further, the morning alarm setting information may include information about a morning alarm date, or information about a morning alarm time, etc.

When the morning alarm time is reached, the controller 180 notifies the alarm event and starts an alarm (S1303).

When the user feels it is difficult to wake up because they were doing homework last night, for example, and repeats pressing a "re-notification" button to sleep again three times (S1305), the controller 180 increases the notification level of the corresponding alarm event by 3 (S1307).

Thereafter, when a time when the corresponding alarm event is notified again is reached, since the notification level of the corresponding alarm event corresponds to 3, the controller 180 requests a quiz answering without a "re-notification" button and notifies an alarm event with voice of large vibration strength and large volume (S1309).

When obtaining a correct answer to the quiz, the controller 180 normally ends notification of the alarm event (S1311). Thereafter, when outputting a query voice for checking whether a user really wakes up and obtaining a positive answer such as "Yes", or "Yeah" to the query voice, the controller 180 decreases the notification level by 1. When the positive answer is not obtained, the controller 180 restarts the alarm event notification.

Referring to FIG. 10, when a user sets a morning alarm for work on a first day, the controller 180 registers an alarm event based on morning alarm setting information by the user (S1401). The user may be in good condition, and instantly confirm when the alarm starts (S1403).

When the alarm starts and the user correctly answers, the controller 180 normally ends the alarm (S1405) and decreases notification of the corresponding alarm event by 1 (S1407). On a second day, an alarm event is notified with notification level 2. When the notification of the alarm event is not normally ended, the controller 180 increases the notification level by 1. When the notification of the alarm event is normally ended, the controller 180 decreases the notification level by 1 (S1409). Notification duration of the alarm event of level 2 may correspond to a half of notification duration of an alarm event of level 3. The notification level may be maximally 5, minimally −5, and initialized to be 0 once a week.

Figure 12:
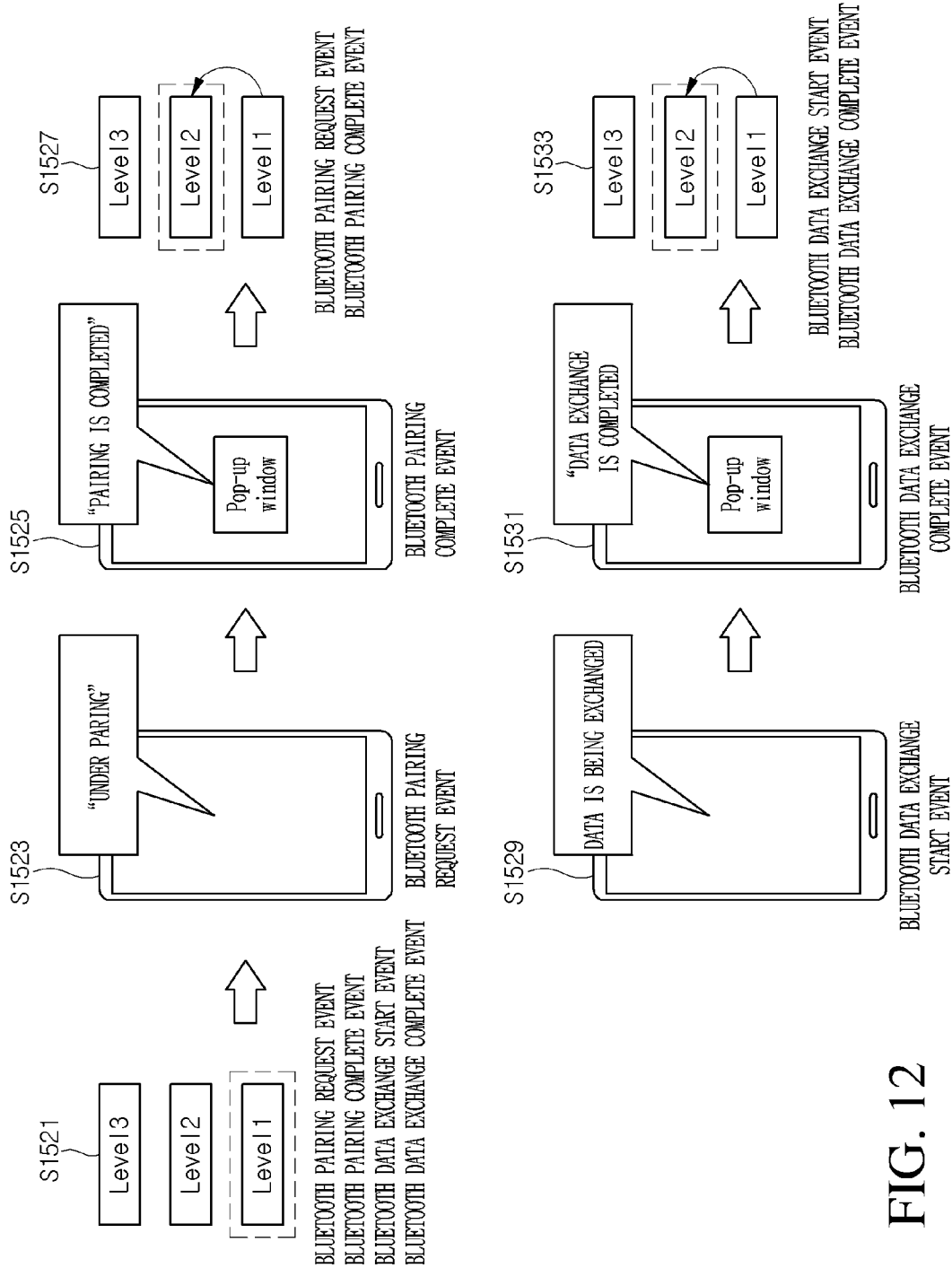
Figure 13:
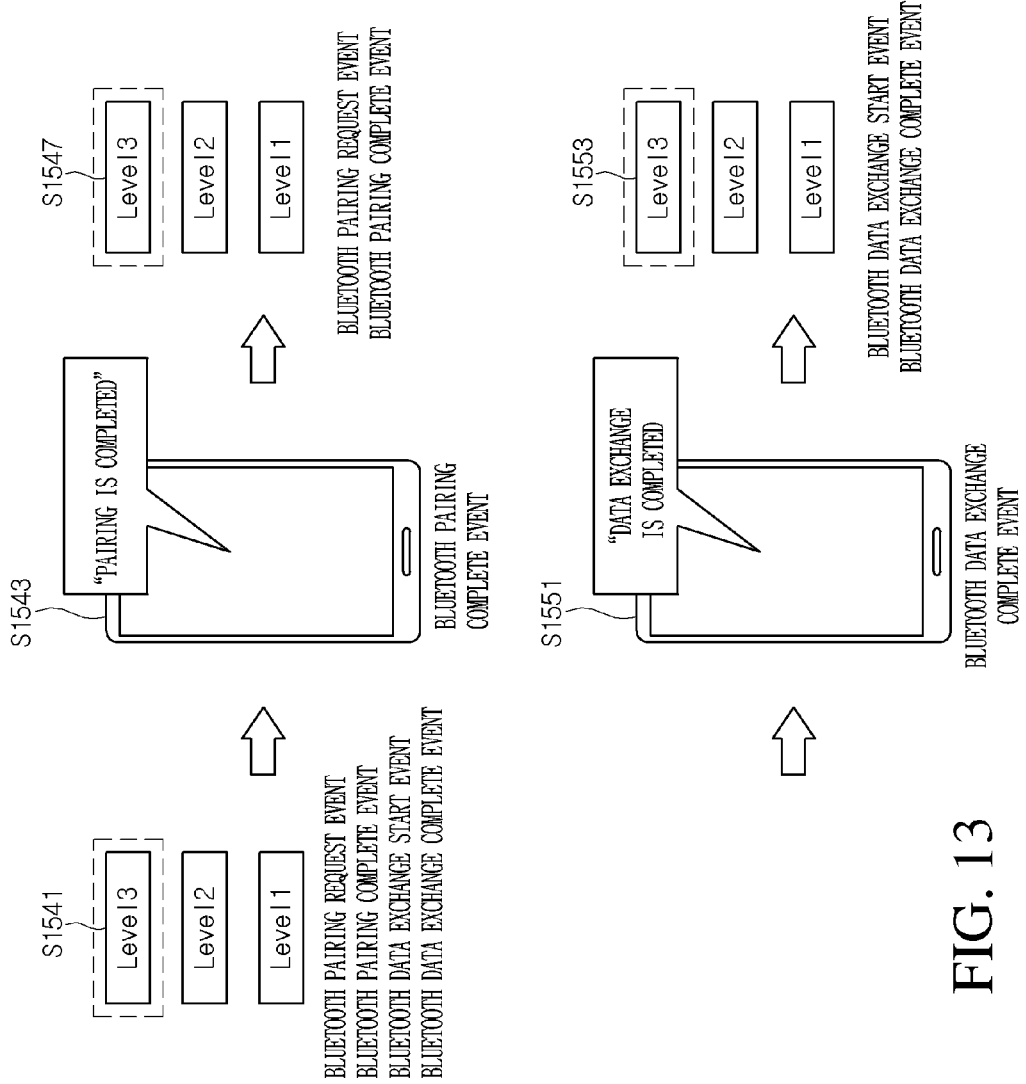

Next, a Bluetooth tethering method according to an embodiment of the present invention is described with reference to FIGS. 11 to 13. In particular, FIGS. 11 to 13 illustrate a Bluetooth tethering method according to an embodiment of the present invention.

Figure 11:
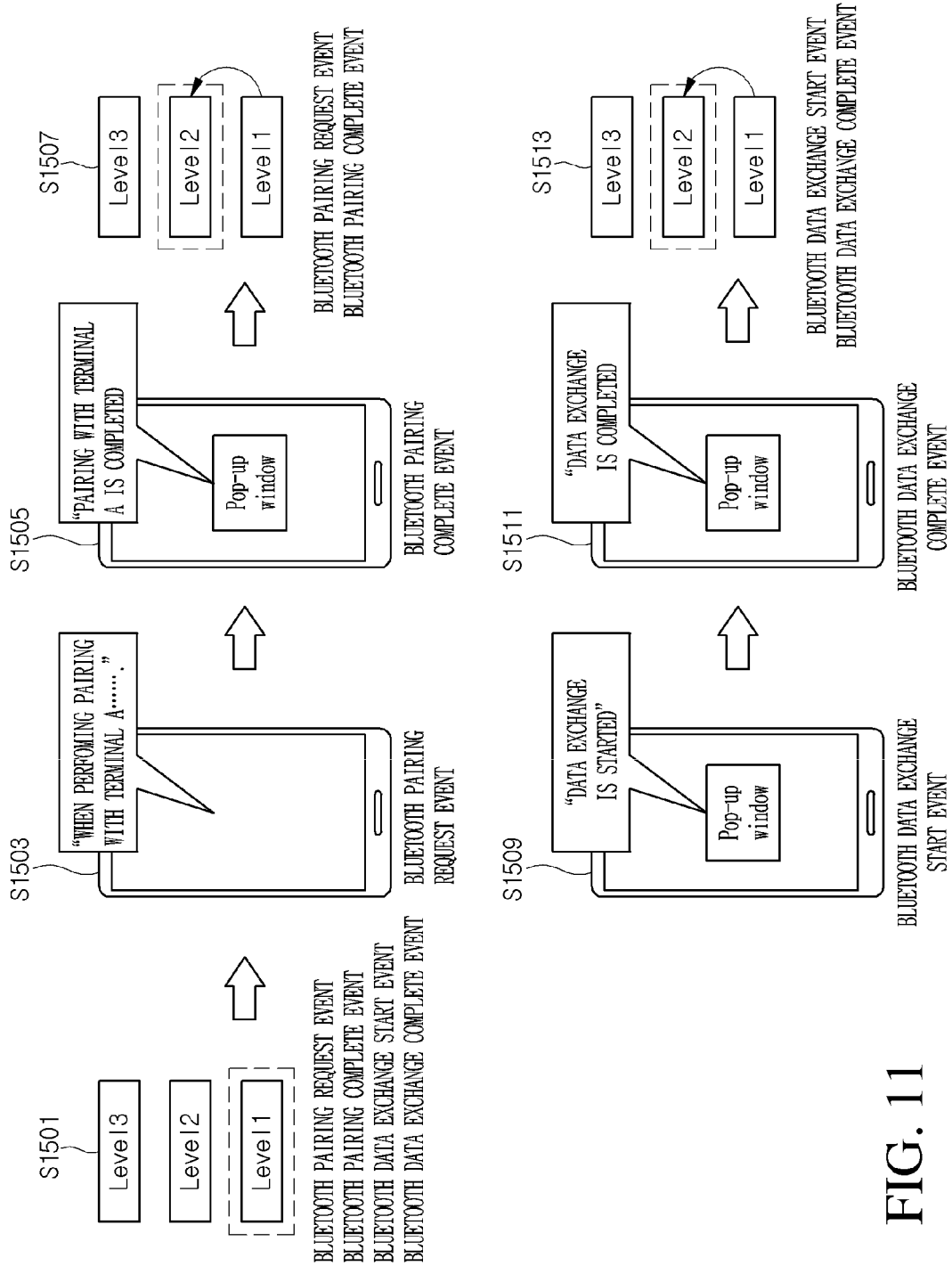
FIGS. 11 to 13 are overviews illustrating a Bluetooth tethering method according to embodiment of the present invention.

Referring to FIG. 11, notification levels of a Bluetooth pairing request event, a Bluetooth pairing complete event, and a Bluetooth data exchange complete event are initially 1 (S1501). In addition, the Bluetooth pairing request event and the Bluetooth pairing complete event may be managed as a single Bluetooth pairing event. Further, a Bluetooth data exchange start event and the Bluetooth data exchange complete event may be managed as a single Bluetooth data event. Two or more of the Bluetooth pairing event, the Bluetooth pairing complete event, the Bluetooth data exchange start event and the Bluetooth data exchange complete event may be managed as a single Bluetooth event.

Embodiment of the present inventions below are described assuming the notification levels of these Bluetooth related events are in a range of 1 to 3. However, the notification level range may be changed according to factory setting or user setting. For example, the notification levels of the Bluetooth related events may have a range of 1 to 5. The notification levels of the Bluetooth related events for a Bluetooth device which is not paired for a predetermined period may be decreased. For example, the notification levels of the Bluetooth related events for a Bluetooth device which is not paired for a week may be decreased by 1.

A notification scheme according to the notification levels (or notification strengths) of the Bluetooth related events may be the same as shown in Table 12.

TABLE 12

| Notification strength | 1 | 2 | 3 |
|---|---|---|---|
| Bluetooth pairing request event | Popup window ON for querying whether to accept pairing + voice "[entire text written on popup window]" | Popup window OFF for querying whether to accept pairing + simplified voice "under pairing" | No notification |
| Bluetooth pairing complete event | Popup window ON for notifying pairing complete + voice "[entire text written on popup window]" | Simplified popup window ON for notifying pairing complete + simplified voice "pairing complete" | Popup window OFF for notifying pairing complete + simplified voice "pairing complete" |
| Bluetooth data exchange start event | Popup window ON for notifying data exchange start + voice "[entire text vritten on popup window]". | Popup window OFF for notifying data exchange start + simplified voice "under data exchanging" | No notification |
| Bluetooth data exchange complete event | Popup window ON for notifying data exchange complete + voice "[entire text written on popup window]" | Simplified popup window ON for notifying data exchange complete + simplified voice "data exchange complete" | Popup window OFF for notifying data exchange complete + simplified voice "data exchange complete" |

When obtaining, as an event trigger, a Bluetooth pairing request between the terminal 100 and a Bluetooth connection target device, the controller 180 notifies the Bluetooth pairing request event with notification level 1. An example of the Bluetooth connection target device includes a wireless keyboard, a mouse, or a headset. The Bluetooth pairing request event notification with notification level 1 may query a user whether to want the Bluetooth pairing. When obtaining a user response of requesting the Bluetooth pairing, the controller 180 can perform the Bluetooth pairing.

When obtaining, as an event trigger, Bluetooth pairing complete, the controller 180 notifies the Bluetooth pairing complete event of notification level 1 (S1505). When the pairing is completed, the controller 180 can increase the notification level of at least one of the Bluetooth pairing request event, the Bluetooth pairing complete event, and the Bluetooth pairing event (S1507). When a count of the pairing complete is a reference value (for example, 5) or greater, the controller 180 can increase, by 1, the notification level of at least one of the Bluetooth pairing request event, the Bluetooth pairing complete event, and the Bluetooth pairing event.

When obtaining, as an event trigger, Bluetooth data exchange start, the controller 180 notifies the Bluetooth data exchange start event of notification level 1 (S1509). The notification of the Bluetooth data exchange start event of notification level 1 may query a user whether to want Bluetooth data exchange. When obtaining a user's reaction of requesting the Bluetooth data exchange, the controller 180 can exchange data.

When obtaining, as an event trigger, Bluetooth data exchange complete, the controller 180 notifies the Bluetooth data exchange complete event of notification level 1 (S1511). When data exchange is completed, the controller 180 can increase notification level of at least one of the Bluetooth data exchange start event, the Bluetooth data exchange complete event, and the Bluetooth data event (S1513). When a count of the data exchange complete is a reference value (for example, 5) or greater, the controller 180 can increase, by 1, the notification levels of at least one of the Bluetooth data exchange start event, the Bluetooth data exchange complete event, and the Bluetooth data event.

Referring FIG. 12, the notification levels of the Bluetooth pairing request event, the Bluetooth pairing complete event, and the Bluetooth data exchange complete event are 2 (S1521). When obtaining, as an event trigger, a Bluetooth pairing request between the terminal 100 and a Bluetooth connection target device, the controller 180 notifies the Bluetooth pairing request event of notification level 2 (S1523). Further, the controller 180 can automatically perform the Bluetooth pairing without querying a user whether to want the Bluetooth pairing.

When obtaining, as an event trigger, the Bluetooth pairing complete, the controller 180 notifies the Bluetooth pairing complete event of notification level 2 (S1525), When the paring is completed, the controller 180 can increase the notification level of at least one of Bluetooth pairing request event, the Bluetooth pairing complete event, and the Bluetooth pairing event (S1527). When a count of the pairing complete is a reference value (for example, 5) or greater, the controller 180 can increase, by 1, the notification levels of at least one of the Bluetooth pairing request event, the Bluetooth pairing complete event, and the Bluetooth pairing event.

When obtaining, as an event trigger, the Bluetooth data exchange start, the controller 180 notifies the Bluetooth data exchange start event of notification level 2 (S1529). Further, the controller 180 automatically performs Bluetooth data exchange without querying a user whether to want Bluetooth data exchange.

When obtaining, as an event trigger, the Bluetooth data exchange complete, the controller 180 notifies the Bluetooth data exchange complete event of notification level 2 (S1531). When the data exchange is completed, the controller 180 can increase a notification level of at least one of the Bluetooth data exchange start event, the Bluetooth data exchange complete event, and Bluetooth data event (S1533). When a count of the data exchange complete is a reference value (for example, 5) or greater, the controller 180 can increase, by 1, a notification level of at least one of the Bluetooth data exchange start event, the Bluetooth data exchange complete event, and Bluetooth data event.

Referring to FIG. 13, notification levels of the Bluetooth pairing request event, the Bluetooth pairing complete event, and Bluetooth data exchange complete event is 3 (S1541). When the notification level of the Bluetooth pairing request event is 3, the controller 180 can not perform any notification in relation to the Bluetooth pairing request event. In addition, the controller 180 can automatically perform. Bluetooth pairing without querying a user whether to want the Bluetooth pairing.

When obtaining, as an event trigger, Bluetooth pairing complete, the controller 180 notifies the Bluetooth pairing complete event of notification level 3 (S1545). When the notification level of the Bluetooth pairing request event is a maximum value (for example, 3), the controller 180 maintains the notification level of at least one of the Bluetooth pairing request event, the Bluetooth pairing complete event, and the Bluetooth pairing event (S1547).

When obtaining, as an event trigger, the Bluetooth data exchange start, the controller 180 notifies the Bluetooth data exchange start event of notification level 3 (S1549). When the notification level of the Bluetooth data exchange start event is 3, the controller 180 does not perform any notification in relation to the Bluetooth data exchange start event. In addition, the controller 180 can automatically perform the Bluetooth data exchange without querying a user whether to want the Bluetooth data exchange.

When the notification level of the Bluetooth pairing request event is a maximum value, the controller 180 maintains a notification level of at least one of the Bluetooth data exchange start event, the Bluetooth data exchange complete event, and the Bluetooth data event (S1553).

Figure 14:
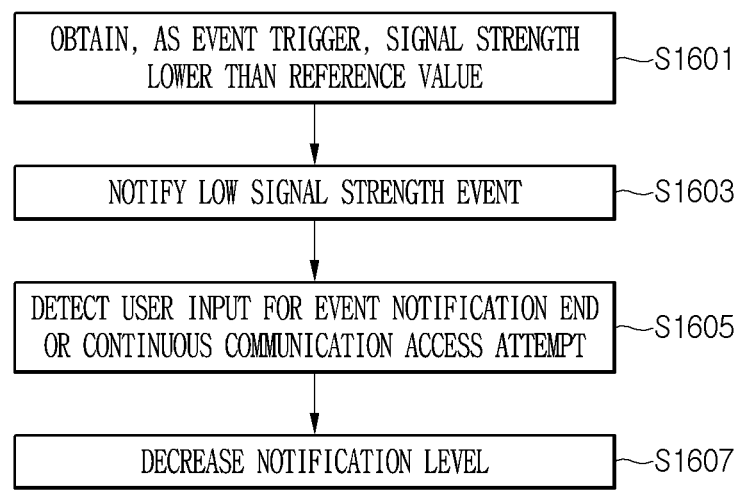
FIG. 14 is a flowchart illustrating a method of notifying a low signal strength event according to an embodiment of the present invention.

Next, a method of notifying a low signal strength event according to an embodiment of the present invention is described with reference to FIG. 14. In particular, FIG. 14 is a flowchart illustrating a method of notifying the low signal strength event according to an embodiment of the present invention.

During using or attempting to access communication such as DMB, Wi-Fi, or telephone, when obtaining, as an event trigger, a signal strength lower than a reference value (S1601), the controller 180 notifies a low signal strength event (S1603).

Despite notification of the low signal strength event, when detecting a user input for event notification end or continuous attempt to access communication (S1605), the controller 180 can recognize the user intention to use communication although the signal strength is low. Since continuous notification of an event may cause user inconvenience, the controller 180 decreases a notification level (S1607).

A notification scheme according to a notification level (or notification strength) of the low signal strength event may be the same as shown in Table 13.

notifying the communication data remnant amount event according to an embodiment of the present invention.

The controller 180 compares a remnant amount of available communication data with a reference amount (S1701). When the data remnant amount over a data limit amount is greater than a reference value, the controller 180 sets a notification level of a communication data remnant amount event to a minimum value (for example 1) (S1703), and does not perform any notification (S1705).

When the data remnant amount over the data limit amount is smaller than the reference value, the controller 180 increases the notification level of the communication data remnant event by a reference step (for example, 1) (S1707), displays at least one of a use amount and a remnant amount on a notification bar positioned at a top portion of the display unit 151 (S1709), and performs voice notification including at least one of the use amount and the remnant amount (S1711).

When the communication data no longer remains, the controller 180 sets the notification level of the communication data remnant amount event to a maximum value (for example, 3) (S1713), displays that there is no communication data remnant amount on the notification bar which is positioned on the top portion of the display unit 151 (S1715), performs voice notification that there is no communication data remnant amount (S1717), and displays a popup window which queries a user whether to use data in excess of the data limit amount (S1719).

When obtaining a user response of not using data in excess of the data limit amount, the controller 180 sets the notification level of the communication data remnant amount event to a minimum value (for example 1) (S1721). When obtaining a user response of using data in excess of the data limit amount, the controller 180 displays a popup window which queries whether to change the data limit amount (S1723).

When obtaining a user response of using data in excess of the data limit amount but the data limit amount is not changed, the controller 180 sets the notification level of the communication data remnant event to a minimum value (for example 1) (S1725). When obtaining a user response of using data in excess of the data limit amount and the data remnant amount over the data limit amount is greater than a reference value due to a change of the data limit amount (S1727), the controller 180 sets the notification level of the communication data remnant amount event to the minimum value (for example 1) (S1729).

When obtaining a user response of using data in excess of the data limit amount and the data remnant amount over the data limit amount is smaller than a reference value due to a

TABLE 13

| Notification strength | 1 | 2 | 3 |
|---|---|---|---|
| Low signal strength event | Shortest notification period + voice content "The signal is weak" | Popup window notifying low signal strength + short notification period + voice content "The signal is weak" | Popup window notifying low signal strength + long notification period + voice content "The signal is weak" |

Figure 15:
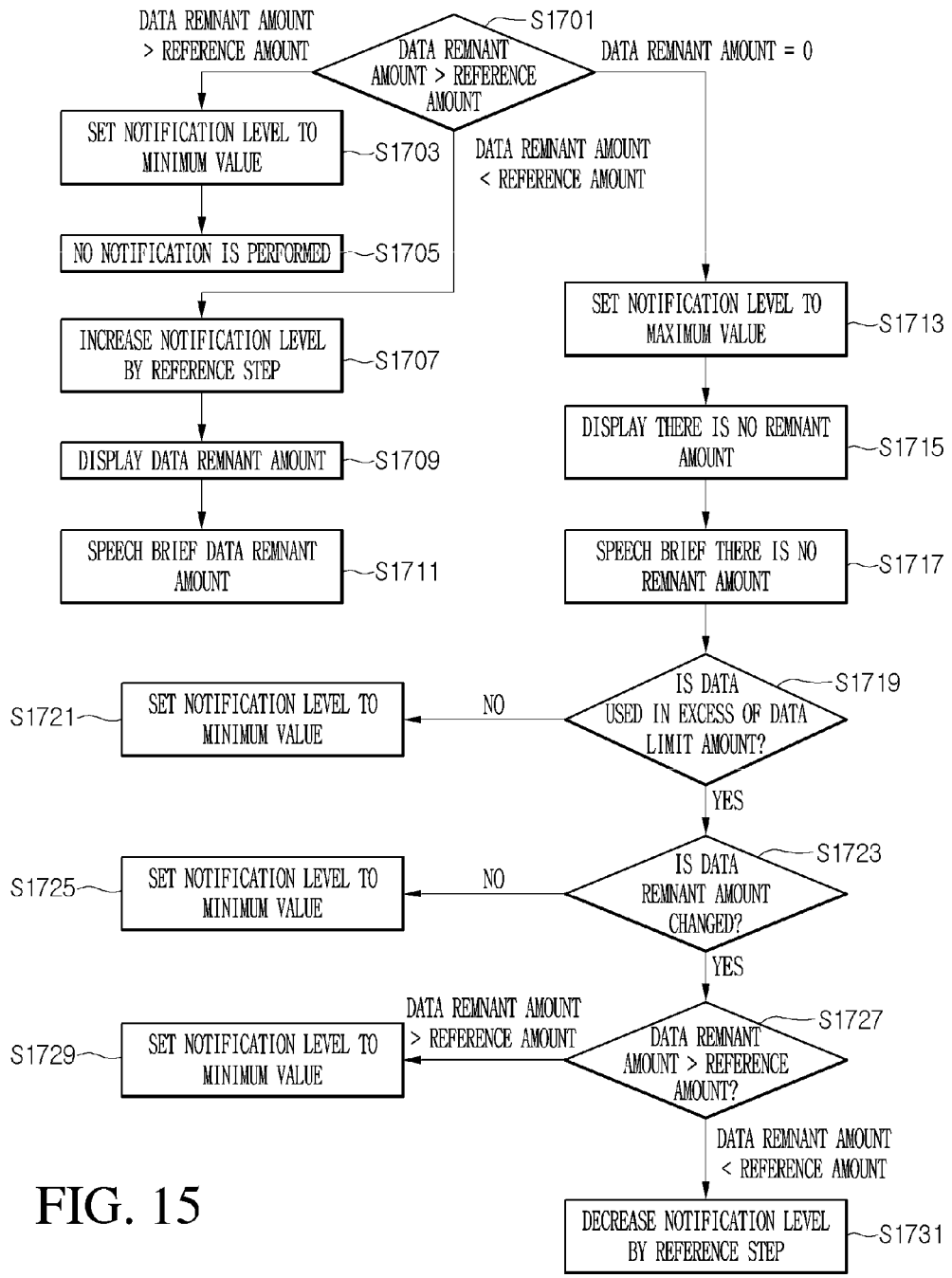
FIG. 15 is a flowchart illustrating a method of notifying a remnant amount of communication data according to an embodiment of the present invention.

Next, a method of notifying a communication data remnant amount event according to an embodiment of the present invention is described with reference to FIG. 15. In particular, FIG. 15 is a flowchart illustrating a method of change of the data limit amount (S1727), the controller 180 decreases the notification level of the communication data remnant amount event by the reference step (for example 1) (S1731).

Figure 16:
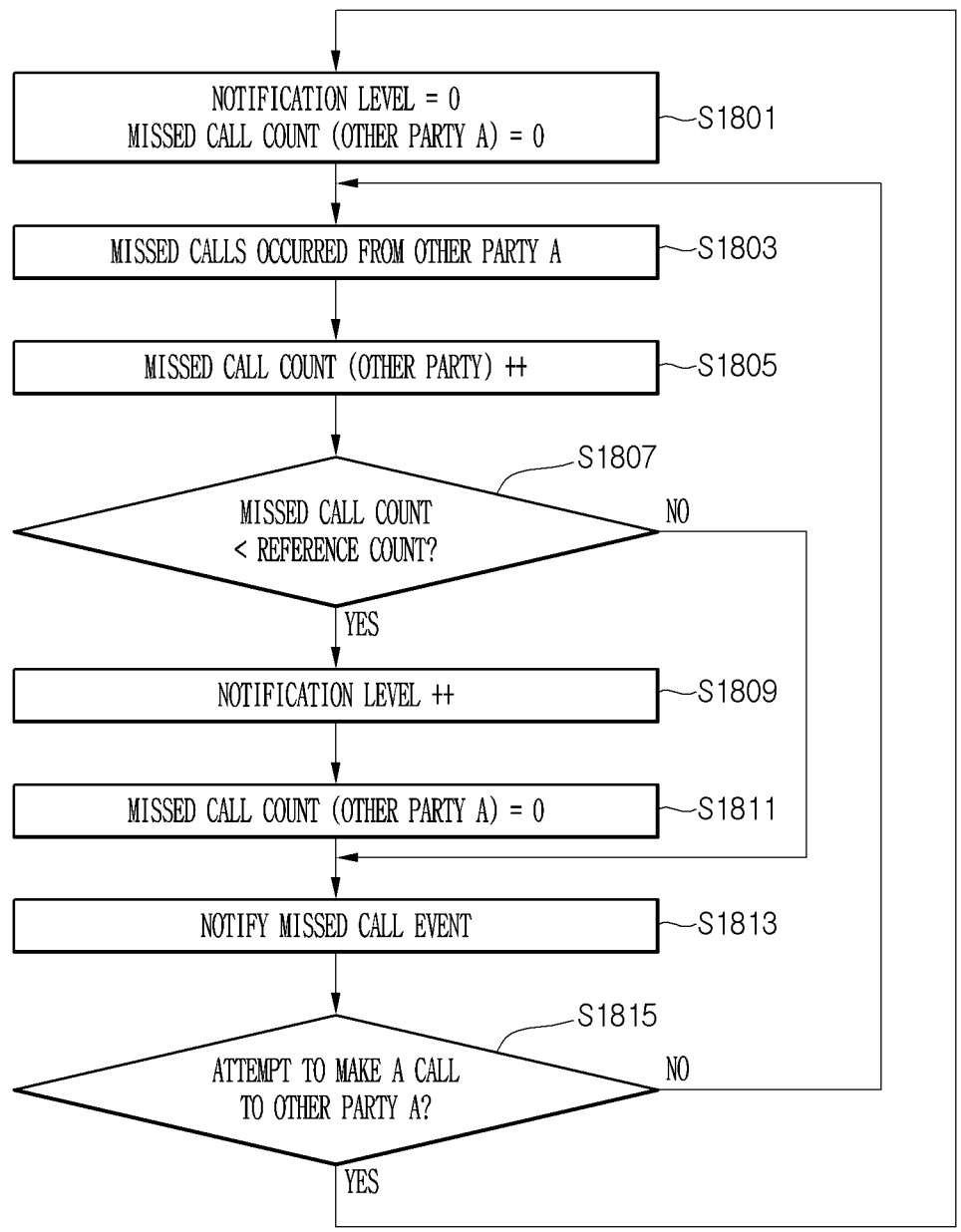
FIG. 16 is a flowchart illustrating a method of notifying a missed call event according to an embodiment of the present invention.

Next, a method of notifying a missed call event according to an embodiment of the present invention is described with reference to FIG. 16. In particular, FIG. 16 is a flowchart illustrating a method of notifying a missed call event according to an embodiment of the present invention.

When a count of missed calls from a specific other party is 0, the controller 180 sets a notification level of the missed call event of the corresponding other party to a minimum value like 0 (S1801). When a missed call occurs from the other party as an event trigger (S1803), the controller 180 increases by 1 the count of the missed calls for this other party (S1805).

The controller 180 compares the count of the missed calls from this other party with a reference count (S1807). Further, the reference count may be a constant regardless of the notification level, or may be variable according to the notification level. For example, the reference counts for notification levels 1, 2, and 3 may respectively be 1, 2, and 3. The reference count value may be increased or decreased according to an increase of the notification level.

When the count of the missed calls from this other party is smaller than the reference count, the controller 180 notifies the missed call event from this other party according to a current notification level (S1813). When the count of the missed calls from this other party is not smaller than the reference count, the controller 180 increases the notification level of the missed call event of this other party by a reference step like 1 (S1809), resets the count of the missed calls from this other party (S1811), and notifies the missed call event of this other party according to the increased notification level (S1813).

When, as a user's reaction, an attempt to make a call to the other party is made (S1813), the controller 180 changes the notification level of the missed call event of this other party into a minimum value (S1815). Despite the notification of the missed call event, an attempt to make a call to the other party is not made, the controller 180 does not change the notification level of the missed call event of this other party.

Figure 17:
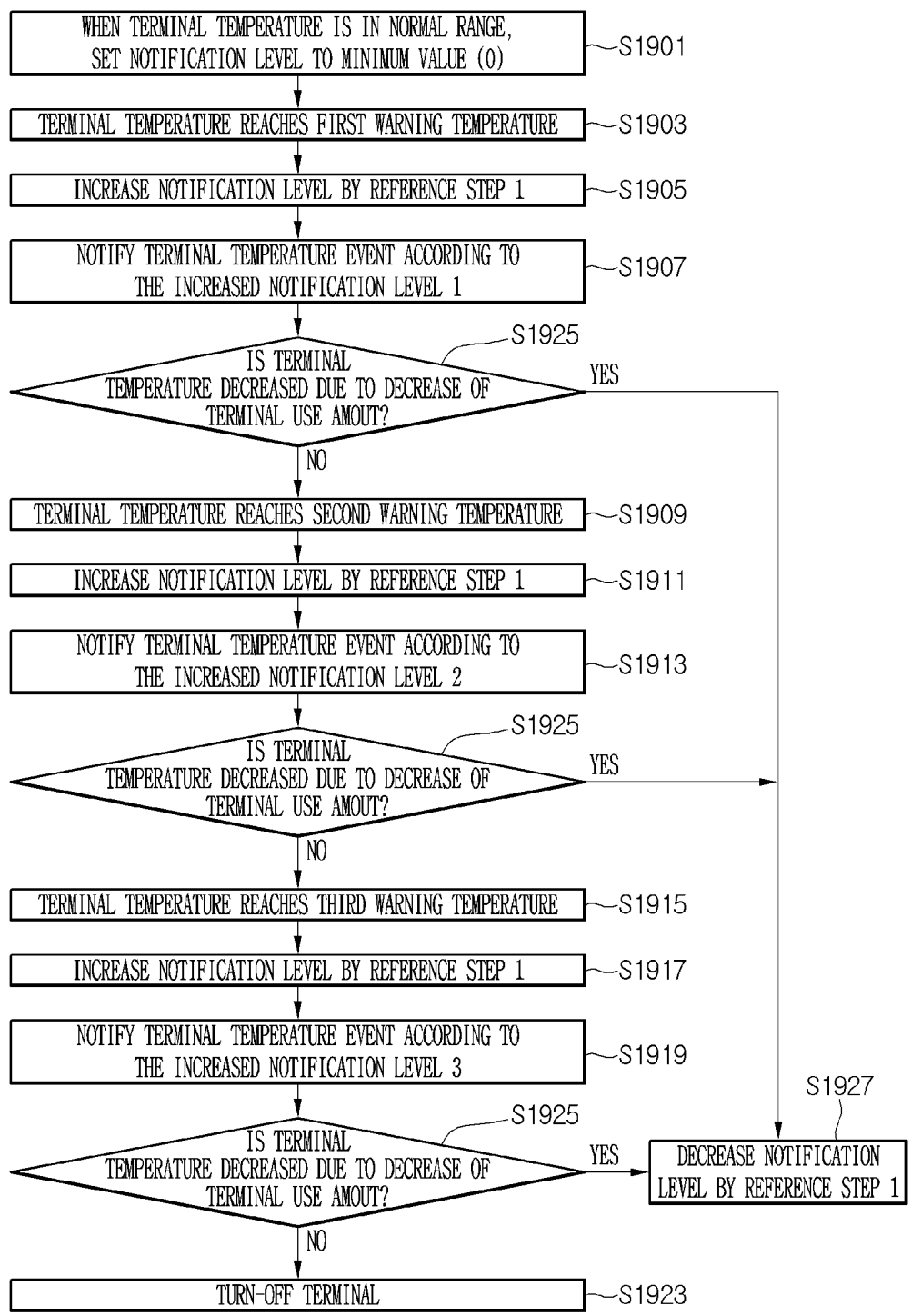
FIG. 17 is a flowchart illustrating a method of notifying a terminal temperature event according to an embodiment of the present invention.

Next, a method of notifying a terminal temperature event according to an embodiment of the present invention is described with reference to FIG. 17. In particular, FIG. 17 is a flowchart illustrating a method of notifying a terminal temperature event according to an embodiment of the present invention.

When terminal temperature is in a normal range, the controller 180 sets the notification level of the terminal temperature event to a minimum value like 0 (S1901). When, as an event trigger, the terminal temperature reaches a first warning temperature (S1903), the controller 180 increases the notification level of the terminal temperature event by a reference step like 1 (S1905), and notifies the terminal temperature event according to the increased notification level 1 (S1907).

When, as an event trigger, the terminal temperature reaches a second warning temperature (S1909), the controller 180 increases the notification level of the terminal temperature event by a reference step like 1 (S1911), and notifies the terminal temperature event according to the increased notification level 2 (S1913).

When, as an event trigger, the terminal temperature reaches a third warning temperature (S1909), the controller 180 increases the notification level of the terminal temperature event by a reference step like 1 (S1917), and notifies the terminal temperature event according to the increased notification level 3 (S1919). The third warning temperature may be higher than the second warning temperature, and the second warning temperature may be higher than the first warning temperature.

A notification scheme according to the notification level (or notification strength) of the terminal temperature may be the same as shown in Table 14.

TABLE 14

| Notification level (notification strength) | 1 | 2 | 3 |
|---|---|---|---|
| Terminal temperature event | Audio volume level 1 + voice content "Temperature should be lowered" | Audio volume level 2 + voice content "Temperature should be lowered. After[M] minutes, terminal is powered off" | Audio volume level 3 + vibration notification + red warning screen + flickering effect + voice content "Temperature should be lowered. After a while, terminal is powered off" |

When the terminal temperature reaches a maximum warning temperature and the notification level of the terminal temperature event reaches a maximum value, the controller 180 turns off the terminal 100 for protecting the terminal 100 regardless of user intention (S1923).

When, as a user's reaction, a terminal use amount decreases and the terminal temperature is lowered (S1925), the controller 180 decreases the notification level of the terminal temperature event by a reference step 1 (S1927).

Next, a method of notifying a message arrival event according to an embodiment of the present invention is described with reference to FIGS. 18 and 19. In particular, methods shown in FIGS. 18 and 19 are applicable to a wearable terminal device that message writing and message confirmation are relatively inconvenient than a phone type terminal.

Figure 18:
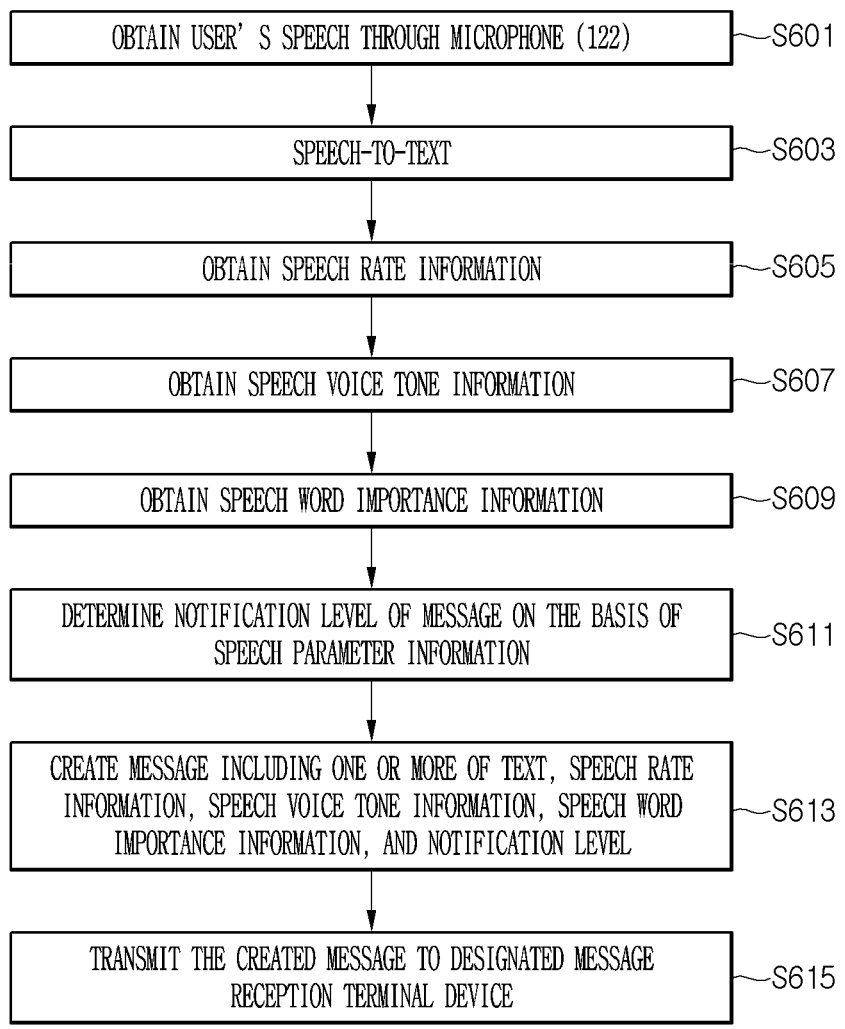
FIG. 18 is a flowchart illustrating a message creating method according to an embodiment of the present invention.
Figure 19:
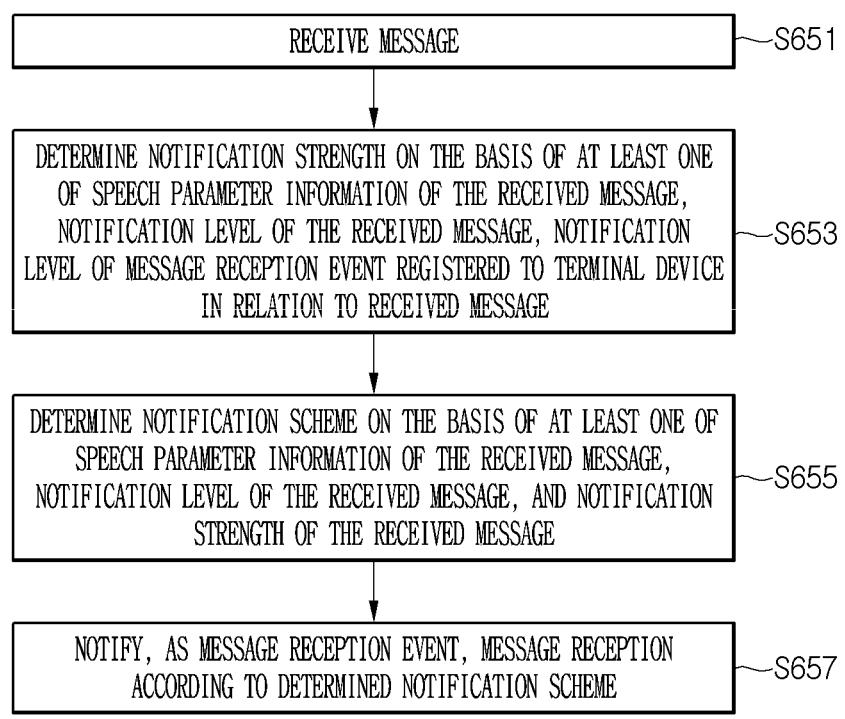
FIG. 19 is a flowchart illustrating a message receiving method according to an embodiment of the present invention.

FIG. 18 is a flowchart illustrating a message creating method according to an embodiment of the present invention. Referring to FIG. 18, a message transmitting terminal device obtains user speech through the microphone 122 (S601). The message transmitting terminal device performs speech-to-text conversion that converts the obtained speech into a text (S603).

The message transmitting terminal device obtains speech rate information as speech characteristics information from the user's speech (S605). The speech rate information may be absolute information that represents how fast a user speaks or may be relative information that represents how faster a user speaks than usual. The message transmitting terminal device may accumulate and average speech rates of the user, and create the speech rate information. For example, a value of the speech rate information may have any one of three grades of high, medium, and low.

The message transmitting terminal device obtains, as speech characteristics information, speech voice tone information from the user speech (S607). The speech voice tone information may be absolute information that represents how high a voice tone in which a user speaks is or may be relative information that represents how higher a voice tone in which a user speaks is than usual. The message transmitting terminal device may accumulate and average voice tones of the user, and create the voice tone information. For example, a value of the voice tone information may have any one of three grades of high, medium, and low.

The message transmitting terminal device obtains, as speech characteristics information, speech word importance information from the user speech (S609). The speech word importance information may be absolute information that represents how important words that a user uses and speaks is or may be relative information that represents how more important words that a user uses and speaks is than usual. The message transmitting terminal device may accumulate and average speech word importance of the user, and create the speech word importance information. For example, a value of the speech word importance information may have any one of three grades of high, medium, and low.

The message transmitting terminal device determines a notification level of a message based on speech parameter information including at least one of the speech rate information, the speech voice tone information, the speech word importance information (S611).

The message transmitting terminal device creates a message including a text converted from user speech (S613). Further, the message may include message importance information including one or more of the speech rate information, the speech voice tone information, the speech word importance information, and the notification level.

The message transmitting terminal device transmits the created message to a designated message receiving terminal device (S615). The message transmitting terminal device may transmit the created message to the message receiving terminal device through direct communication or an infrastructure network.

FIG. 19 is a flowchart illustrating a message receiving method according to an embodiment of the present invention. A message receiving terminal device receives a message (S651). The message receiving terminal device determines a notification strength based on at least one of speech characteristics information of the received message, a notification level of the received message, a notification level of a message reception event registered to the terminal device in relation to the received message (S653). When the received message does not have a notification level, the message receiving terminal device may determine the notification level of the received message by using the speech characteristics information of the received message.

The message receiving terminal device determines a notification scheme based on at least one of the speech characteristics information of the received message, the notification level of the received message, and notification strength of the received message (S655). For example, when notifying a message by using the speech characteristics information and the received message notification strength, the message receiving terminal device may output a voice for a message text according to volume, repetition, and content corresponding to notification strength in a rate and voice tone that the other party speaks. The message receiving terminal device notifies, as a message reception event, reception of a message according to the determined notification scheme (S657).

According to embodiment of the present inventions, the above-described methods can also be embodied as computer readable codes on a computer readable recording medium. Examples of the computer readable recording medium include read-only memory (ROM), random-access memory (RAM), CD-ROMs, magnetic tapes, floppy disks, and optical data storage devices.

According to embodiment of the present inventions, as an event is more important, a user can rapidly recognize the event by allowing a terminal to adaptively differentiate event notification strength according to importance, situations, or a terminal user and perform event notification.

Although embodiments of the present invention have been described with reference to a number of illustrative embodiments of the present inventions thereof, it should be understood that numerous other modifications and embodiment of the present inventions can be devised by those skilled in the art that will fall within the spirit and scope of the principles of this invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. A method of controlling a mobile terminal, the method comprising:
   receiving, via a controller of the mobile terminal, an event trigger indicating a first event of a plurality of events occurred on the mobile terminal, wherein each of the plurality of events is allocated to a corresponding notification level among a plurality of notification levels;
   checking, via the controller, a first notification level among the plurality of notification levels allocated to the first event corresponding to the event trigger;
   obtaining importance information of the first event from the event trigger;
   determining a notification strength of the first event with respect to a reference value; and
   outputting a notification notifying the first event with the notification strength obtained based on the importance information and the first notification level to a user of the mobile terminal.

2. The method according to claim 1, wherein the outputting the notification includes outputting a voice notification of the first event with the notification strength.

3. The method according to claim 1,
   wherein the importance information is irrelative to a setting of the mobile terminal, and
   wherein the first notification level represents how important the mobile terminal considers the first event.

4. The method according to claim 3, wherein the event trigger is a message including text converted from speech and including speech characteristic information of the speech, and
   wherein the importance information corresponds to the speech characteristic information.

5. The method according to claim 4, wherein the speech characteristic information includes one or more of a speech rate information, a speech voice tone information, and a speech word importance information of the user speech.

6. The method according to claim 2, further comprising: changing the first notification level in response to a user input to the output voice notification of the first event.

7. The method according to claim 6, further comprising: decreasing the first notification level in response to the user input indicating an end of the notification.

8. The method according to claim 6, further comprising: increasing the first notification level in response to the user input indicating a user's reaction requested by the first event.

9. The method according to claim 6, further comprising: increasing the first notification level in response to the user input indicating the voice notification of the first event is not detected.

10. The method according to claim 2, further comprising: executing an application corresponding to the first event, in response to a user input unlocking the mobile terminal during the notification of the first event.

11. The method according to 2, further comprising: adjusting an amount of content of the voice notification of the first event according to the notification strength.

12. The method according to claim 2, further comprising: adjusting an audio volume of the voice notification according to the notification strength.

13. The method according to claim 2, further comprising: adjusting a type of at least one other terminal that outputs the voice notification according to the notification strength.

14. A mobile terminal, comprising:
a wireless communication unit configured to provide wireless communication;
a display unit configured to display information; and
a controller configured to:
receive an event trigger indicating a first event of a plurality of events occurred on the mobile terminal, wherein each of the plurality of events is allocated to a corresponding notification level among a plurality of notification levels,
check a first notification level among the plurality of notification levels allocated to the first event corresponding to the event trigger,
obtain importance information of the first event from the event trigger,
determine a notification strength of the first even with respect to a reference value, and
output a notification notifying the first event with the notification strength obtained based on the importance information and the first notification level to a user of the mobile terminal.

15. The mobile terminal according to claim 14, wherein the controller outputs the notification as a voice notification of the first event with the notification strength.

16. The mobile terminal according to claim 14,
wherein the importance information is irrelative to a setting of the mobile terminal, and
wherein the first notification level represents how important the mobile terminal considers the first event.

17. The mobile terminal according to claim 16, wherein the event trigger is a message including text converted from speech and including speech characteristic information of the speech, and
wherein the importance information corresponds to the speech characteristic information.

18. The mobile terminal according to claim 17, wherein the speech characteristic information includes one or more of a speech rate information, a speech voice tone information, and a speech word importance information of the user speech.

19. The mobile terminal according to claim 15, wherein the controller is further configured to:
change the first notification level in response to a user input to the output voice notification of the first event.

20. The mobile terminal according to claim 15, wherein the controller is further configured to:
decrease the first notification level in response to the user input indicating an end of the notification.

* * * * *